US007254799B2

(12) United States Patent
Snider

(10) Patent No.: US 7,254,799 B2
(45) Date of Patent: Aug. 7, 2007

(54) METHOD FOR ALLOCATING RESOURCES IN HETEROGENEOUS NANOWIRE CROSSBARS HAVING DEFECTIVE NANOWIRE JUNCTIONS

(75) Inventor: Gregory S. Snider, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 174 days.

(21) Appl. No.: 11/047,981

(22) Filed: Jan. 31, 2005

(65) Prior Publication Data

US 2006/0172521 A1    Aug. 3, 2006

(51) Int. Cl.
*G06F 17/50* (2006.01)
(52) U.S. Cl. .............................. 716/12; 716/1; 977/932; 977/940
(58) Field of Classification Search .................... 716/1, 716/9–14, 16–17; 977/932, 940; 257/3, 257/9, 40
See application file for complete search history.

(56) References Cited

U.S. PATENT DOCUMENTS

| | | | | |
|---|---|---|---|---|
| 6,256,767 B1* | 7/2001 | Kuekes et al. | .................. | 716/9 |
| 6,854,092 B2* | 2/2005 | Hogg | .............................. | 716/1 |
| 6,895,571 B2* | 5/2005 | Hogg | ............................ | 716/12 |
| 6,919,740 B2* | 7/2005 | Snider | ........................... | 716/12 |
| 7,049,626 B1* | 5/2006 | Chen | .............................. | 257/9 |
| 7,117,454 B2* | 10/2006 | Baugh et al. | ................ | 977/940 |
| 2006/0161876 A1* | 7/2006 | DeHon et al. | ................. | 716/17 |

OTHER PUBLICATIONS

El-Sonbaty, Yasser et al., "A Graph-Decomposition Algorithm . . ." Dept. of Elct. & Computer Engineering, Arab Academy for Science and Technology, Alexandria 1029 Egypt.
Cordella, L.P. et al., "An Improved Algorithm for Matching Large Graphs," Departimento di Infrormatica e Sistemistica Universita degli Studi di Napoli Federico II.

* cited by examiner

*Primary Examiner*—Paul Dinh

(57) ABSTRACT

Various embodiments of the present invention provide methods for allocating nanowire junctions in a nanowire crossbar having one or more randomly distributed non-functional crossbar nanowire junctions. In certain embodiments, the method constructs a circuit graph based on the circuit and constructs a crossbar graph based on the nanowire crossbar. A search is then conducted, in the embodiments, in order to determine a monomorphism that respectively maps the nodes and edges of the circuit graph to a subset of nodes and a subset of edges of the crossbar graph. The subset of nodes and subset of edges of the crossbar graph can then be used to allocate nanowire junctions in the nanowire crossbar.

28 Claims, 17 Drawing Sheets

METHOD FOR ALLOCATING RESOURCES IN HETEROGENEOUS NANOWIRE CROSSBARS HAVING DEFECTIVE NANOWIRE JUNCTIONS

TECHNICAL FIELD

The present invention relates to nanoscale electronic devices, and, in particular, to a method for allocating nanowire junctions in nanowire crossbars having one or more randomly distributed defective nanowire junctions.

BACKGROUND OF THE INVENTION

During the past fifty years, the electronics and computing industries have been relentlessly propelled forward by the ever decreasing sizes of basic electronic components, such as transistors and signal lines, and by the correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light, for example, far more technically demanding and expensive higher-energy-radiation-based technologies need to be employed to create smaller components using photolithographic techniques. Not only must expensive semiconductor fabrication facilities be rebuilt in order to use the new techniques, many new obstacles are expected to be encountered. For example, it is necessary to construct semiconductor devices through a series of photolithographic steps, with precise alignment of the masks used in each step with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor services decrease, resulting in an increasing proportion of defective devices during manufacture, and a correspondingly lower yield of useful product. Ultimately, various quantum effects that arise only at molecular-scale distances may altogether overwhelm current approaches to component construction in semiconductors.

In view of these problems, researchers and developers have expended considerable research effort in fabricating microscale and nanoscale electronic devices using alternative technologies. Nanoscale electronic devices generally employ nanoscale signal lines having widths, and nanoscale components having dimensions, of less than 100 nanometers. More densely fabricated nanoscale electronic devices may employ nanoscale signal lines having widths, and nanoscale components having dimensions, of less than 50 nanometers.

Although general nanowire technologies have been developed, it is not necessarily straightforward to employ nanowire technologies to miniaturize existing types of circuits and structures. While it may be possible to tediously construct miniaturized, nanowire circuits similar to the much larger, current circuits, it is impractical, and often impossible, to manufacture such miniaturized circuits using current technologies. Even where such straightforwardly miniaturized circuits are able to be feasibly manufactured, the much higher component densities that ensue from combining together nanoscale components necessitate much different strategies related to removing waste heat produced by the circuits. In addition, the electronic properties of substances may change dramatically at nanoscale dimensions, so that different types of approaches and substances may need to be employed for fabricating even relatively simple, well-known circuits and subsystems at nanoscale dimensions. Thus, new implementation strategies and techniques need to be employed to develop and manufacture useful circuits and structures at nanoscale dimensions using nanowires.

Nanoscale electronic devices can be constructed by selectively fabricating simple electronic components, such as conductors, transistors, resistors, and diodes, and other simple components, in the region between nanowires crossings and are referred to as "functional nanowire junctions." However, the process of constructing a nanoscale electronic device may be complicated by randomly distributed non-functional nanowire junctions located throughout the nanoscale electronic device. A "non-functional" nanowire junction does not allow for the formation of an electronic component. For example, nanowire junctions that are already configured as electronic components that cannot be reconfigured are non-functional. Designers, manufacturers, and users of these systems have recognized the need for methods of implementing functional nanowire junctions in a nanoscale electronic device that has one or more randomly distributed non-functional nanowire junctions.

SUMMARY OF THE INVENTION

Various embodiments of the present invention are directed to methods for implementing a circuit with a nanowire crossbar having a random distribution of one or more non-functional nanowire junctions. In certain embodiments, a circuit-graph representation of the circuit and a crossbar-graph representation of the nanowire crossbar are both constructed. A search is then conducted, in the embodiments, in order to determine a monomorphism that respectively maps the nodes and edges of the circuit graph to a subset of nodes and a subset of edges of the crossbar graph. The subset of nodes and subset of edges of the crossbar graph can then be used to allocate nanowire junctions in the nanowire crossbar.

BRIEF DESCRIPTION OF THE DRAWINGS

FIG. 8C illustrates an induced subgraph.

DETAILED DESCRIPTION OF THE INVENTION

Nanowire crossbars represent one of a number of emerging nanoscale-electronic circuit configuration media that can be used to construct nanoscale-electronic devices. Nanowire crossbars, however, often contain one or more randomly distributed non-functional nanowire junctions due to the difficulty of precise manufacturing at the nanoscale level. Various embodiments of the present invention are directed to methods for implementing circuits on nanowire crossbars that have one or more randomly distributed non-functional nanowire junctions. The methods determine both a graphical representation of a circuit and a graphical representation of a nanowire crossbar that is intended to serve as the apparatus for implementing the circuit. In particular, the nanowire-crossbar graph identifies non-functional nanowire junctions. Based on these graphical representations, concepts of graph theory are employed to determine the functional nanowire junctions within the nanowire crossbar that can be used to implement the circuit. The present invention is described below in three following subsections: (1) nanowire crossbars; (2) graph theory definitions and terminology; and (3) embodiments of the present invention.

Nanowire Crossbars

Figure 1:
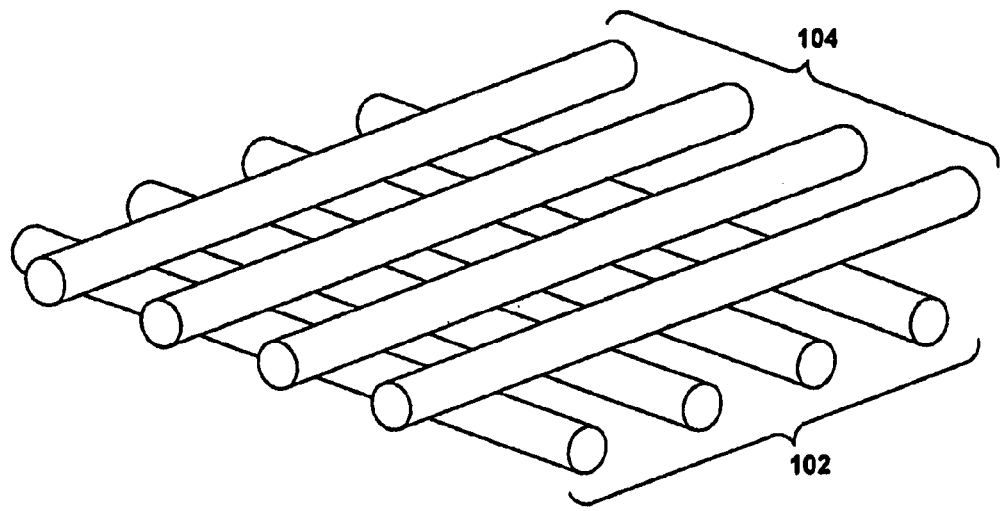
FIG. 1 illustrates a basic nanowire crossbar.
Figure 3A:
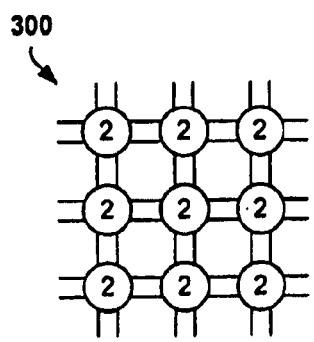
FIG. 3 illustrates one possible approach for configuring a network of nanoscale electrical components from a two-dimensional nanowire crossbar.
Figure 3B:
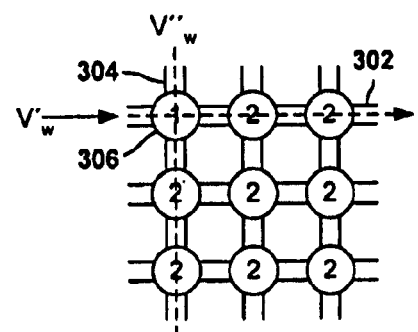
Figure 3C:
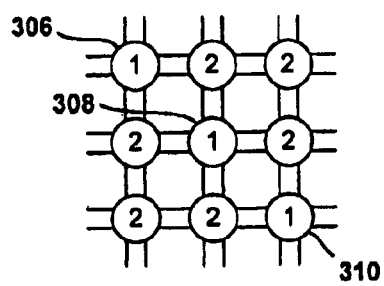
Figure 3D:
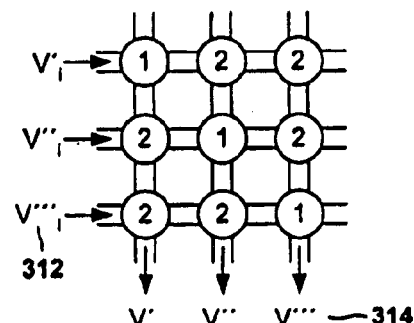

A relatively new and promising technology involves nanowire crossbars. FIG. 1 illustrates a two-layer nanowire crossbar. In FIG. 1, a first layer of approximately parallel nanowires 102 is overlain by a second layer of approximately parallel nanowires 104 roughly perpendicular, in orientation, to the nanowires of the first layer 102, although the orientation angle between the layers may vary. The two layers of nanowires form a lattice, or crossbar, each nanowire of the second layer 104 overlying all of the nanowires of the first layer 102 and coming into close contact with each nanowire of the first layer 102 at intersection points, or nanowire junctions that represent the closest contact between two nanowires.

Nanowires can be fabricated using mechanical nanoprinting techniques. Alternatively, nanowires can be chemically synthesized and can be deposited as layers of nanowires in one or a few process steps. Other alternative techniques for fabricating nanowires may also be employed. Thus, a two-layer nanowire crossbar comprising first and second layers, as shown in FIG. 1, can be manufactured via a relatively straightforward process. Many different types of conductive and semi-conductive nanowires can be chemically synthesized from metallic and semiconductor substances, from combinations of these types of substances, and from other types of substances. A nanowire crossbar may be connected to microscale signal-line leads or other electronic leads through a variety of different methods to incorporate the nanowires into electrical circuits.

Figure 2:
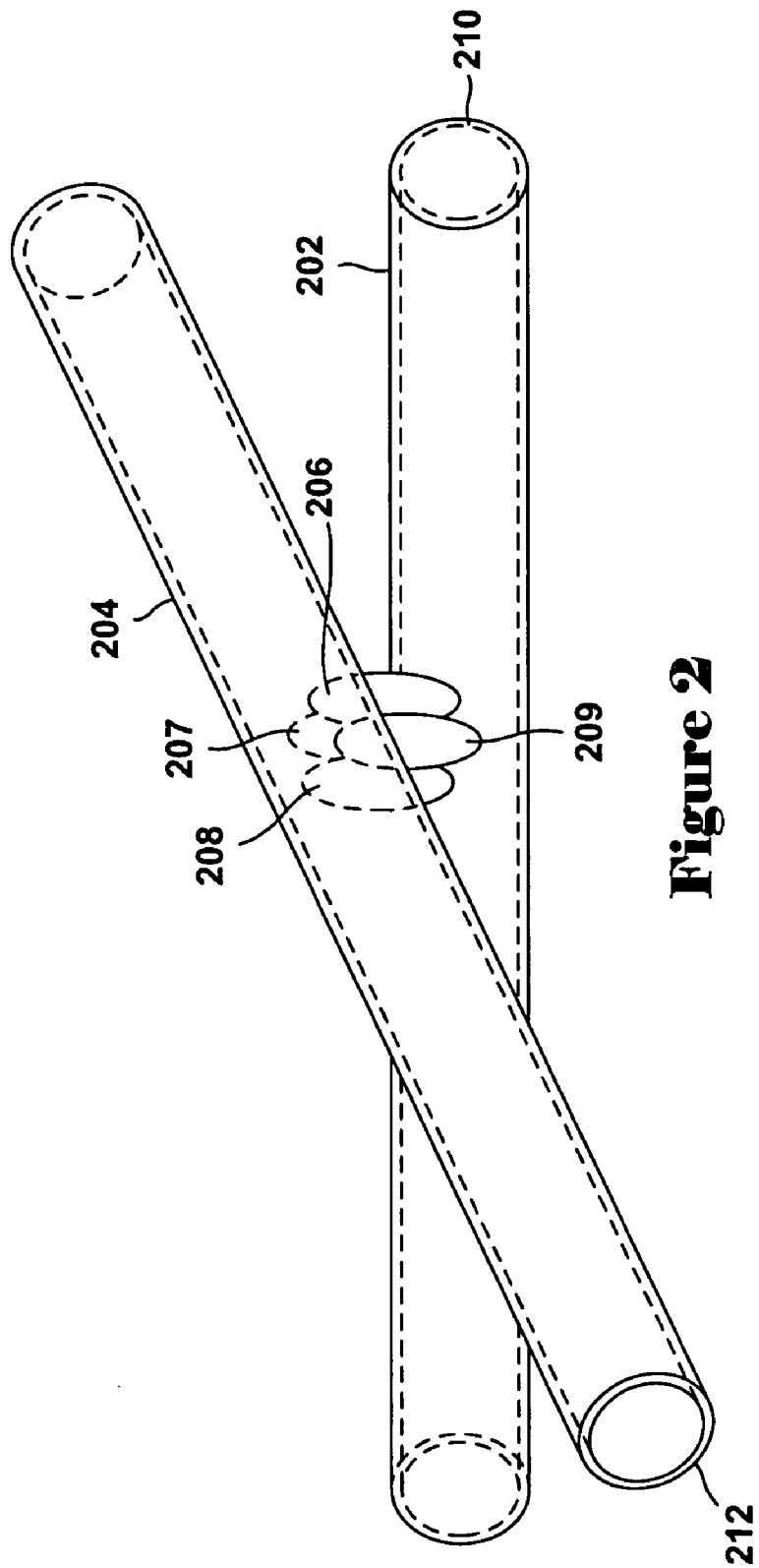
FIG. 2 illustrates a nanowire junction, or intersection, between two roughly orthogonal nanowires.

Nanowire crossbars are not only layers of relatively parallel conductive elements, but may also be used to create arrays of nanoscale electronic components, such as transistors, diodes, resistors, and other familiar basic electronic components. FIG. 2 illustrates a nanowire junction between nanowires of two contiguous layers within a nanowire crossbar. In FIG. 2, the nanowire junction between a first nanowire 202 of a first nanowire layer intersects a second nanowire 204 of a second nanowire layer. Note that the nanowire junction may or may not involve physical contact between the two nanowires 202 and 204. As shown in FIG. 2, the two nanowires are not in physical contact at their closest point of approach, but the gap between them is spanned by a small number of molecules 206–209. Various different types of molecules may be introduced at nanowire junctions for a variety of different purposes. In many cases, the molecules of a nanowire junction may be accessed, for various purposes, through different voltage levels or current levels placed on the nanowires forming the nanowire junction. The molecules spanning the nanowire junction in FIG. 2 may have various different quantum states in which the molecules exhibit resistive, semiconductor-like, or conductive electrical properties. The current passing between the two nanowires intersecting at a nanowire junction may be a nonlinear function of the voltage across the nanowire junction as a result of quantum-mechanical tunneling of electrons through relatively low-energy, unoccupied quantum states of the molecules. The quantum states, and relative energies of quantum states, of the molecules may be controlled by applying differential currents or voltages to the nanowires forming the interaction. For example, molecules may be conductive in a reduced state, but may act as insulators in an oxidized state, with redox reactions controlled by voltage levels determining which of the quantum states the molecules inhabit.

In general, a nanowire junction is anisotropic, having a polarity or direction with respect to physical properties, including electrical properties. This anisotropy may arise from different chemical and/or physical properties of nanowires in the two layers of a nanowire crossbar, may arise from asymmetries of nanowire junction molecules combined with nanowire junction molecules being uniformly oriented with respect to the nanowire layers, and may arise both from differences in the properties of the nanowires as well as nanowire-junction-molecule asymmetries. The fact that nanowire junctions may have polarities allows for controlling nanowire junction properties by applying positive and negative voltages to nanowire junctions, eliciting forward and reverse currents within the nanowire junctions.

As shown in FIG. 2, the nanowires may include outer coatings, such as outer coatings 210 and 212. The outer coatings may serve to insulate nanowires from one another, may constitute the molecules that serve to span nanowire junctions when the nanowires are placed in contact with one another, or may serve as modulation-dopant-layers, which can be selectively activated to dope semiconductor nanowires. Both p-type and n-type modulation dopant coatings have been developed. In other applications, the molecules spanning nanowire junctions between crossing nanowires may be introduced as a separate layer formed between layers of nanowires. In some cases, the state changes of nanowire-junction molecules may not be reversible. For example, the nanowire-junction molecules may initially be resistive, and may be made conductive through application of relatively high voltages. In other cases, the nanowire-junction molecules may be conductive, but the molecules may be irreversibly damaged, along with portions of the nanowires proximal to the nanowire junctions, through application of very high voltage levels, resulting in disrupting conductivity between the two nanowires and breaking electrical connection between them. In yet other cases, the nanowire-junction molecules may transition reversibly from one state to another and back, so that the nanoscale electrical components configured at nanowire junctions may be reconfigured, or programmed, by application of differential voltages to selected nanowire junctions.

FIG. 3 illustrates one possible approach to configuring a network of reconfigurable nanoscale electrical components from a two-layer nanowire crossbar. In FIGS. 3A–D, a small 3×3 nanowire crossbar is shown, with circles at all nine nanowire junctions indicating the state of the nanowire-junction molecules. In one state, labeled "1" in FIGS. 3A–D, the nanowire-junction molecules may have certain semiconductor, or conductive properties, while in a second state, labeled "2" in FIGS. 3A–D, nanowire-junction molecules may have different properties. Initially, as shown in FIG. 3A, the states of the nanowire junctions of the nanowire crossbar 300 are in the state labeled "2." Next, as shown in FIG. 3B, each nanowire junction may be uniquely accessed by applying a write voltage, or configuring voltage, to the nanowires that form the nanowire junction in order to configure, or program, the nanowire junction to have the state "1." For example, in FIG. 3B, a first write voltage $v_w"$ is applied to horizontal nanowire 302 and a second write voltage $v_w"$ is applied to vertical nanowire 304 to change the state of the nanowire junction from "2" to "1." Individual nanowire junctions may be configured through steps similar to the steps shown in FIG. 3B to finally result in a fully configured nanoscale component network as shown in FIG. 3C. Note that, in FIG. 3C, the states of nanowire junctions 306, 308, and 310 that form a downward-slanted diagonal through the nanowire crossbar have been configured by selective application of write voltages. Finally, as shown in FIG. 3D, the nanoscale electrical component network can be used as a portion of an integrated circuit. Input voltages $v_i'$, $v_i"$, and $v_i'''$ may be applied to the nanoscale electrical component lattice as inputs 312 and output voltages $v_o'$, $v_o"$, and $v_o'''$ 314 may be accessed as the result of operation of the nanoscale electrical component network that represents a portion of an integrated circuit. In general, the input and output voltages $v_i'$, $v_i"$, and $v_i'''$ and $v_o'$, $v_o"$, and $v_o'''$ relatively low magnitudes compared with the write voltages $v_w$. Depending on the types of nanowires, types of dopants employed in the case of semiconductor nanowires, and the types of nanowire-junction molecules employed in the nanowire crossbar, many different, but similar configuring processes may be used to configure nanowire crossbars into nanowire-based electrical components networks. The example of FIG. 3 is meant to illustrate a general process by which nanowire crossbars may be configured as useful portions of electronic circuits.

Figure 4A:
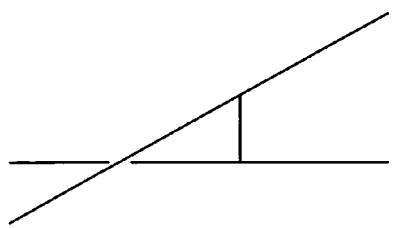
FIG. 4 schematically illustrates a number of simple electrical components that can be programmed at the nanowire junctions of nanowires in nanowire crossbars.
Figure 4B:
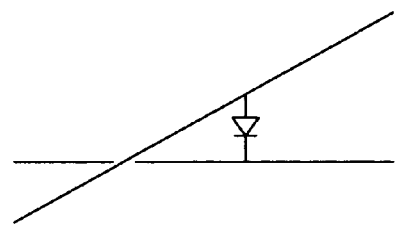
Figure 4C:
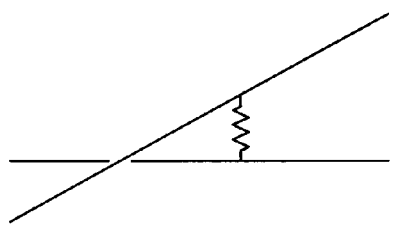
Figure 4D:
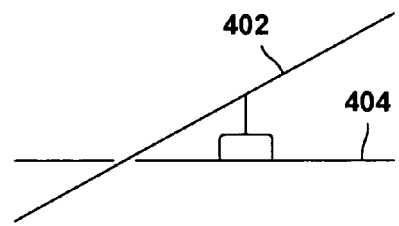
Figure 4E:
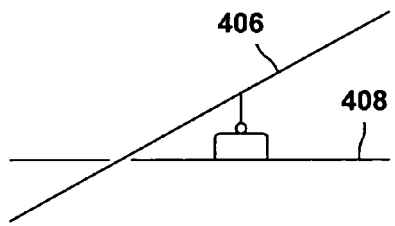
Figure 4F:
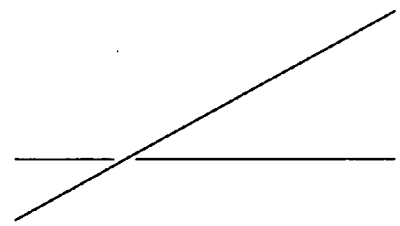

Nanowire junctions of nanowires in nanowire crossbars may be configured, in various techniques depending on the chemical nature of the nanowires and nanowire-junction-spanning molecules, to form a wide variety of different, simple electronic devices. FIG. 4 schematically illustrates a number of simple electrical components that can be configured at the nanowire junctions of nanowires in nanowire crossbars. A nanowire junction may represent (1) a simple conductive connection between the two nanowires, as shown in FIG. 4A; (2) a diode that conducts current in only one direction between the two nanowires, as shown in FIG. 4B; (3) a resistor, with the magnitude of resistance configurable by application of different configuring voltages, as shown in FIG. 4C; (4) a negatively doped field-effect transistor ("nFET"), as shown in FIG. 4D; (5) a positively doped field-effect transistor ("pFET"), as shown in FIG. 4E; and (6) the crossing of two conductive nanowires, with the voltage and current associated with each nanowire completely independent from one another, as shown in FIG. 4F. In the case of the NFET, shown in FIG. 4D, a relatively low voltage state on the gate wire 402 results in current passing through the source/drain wire 404, while a relatively high voltage on the gate wire 402 prevents conduction of current on the source/drain nanowire 404. The pFET of FIG. 4E exhibits opposite behavior, with a relatively high voltage on the gate wire 406 facilitating flow of current through the source/drain wire 408, and relatively low voltage on the gate wire 406 preventing the flow of current on the source/drain wire 408. Note also that a nanowire junction may also be configured as an insulator, essentially interrupting conduction at the nanowire junction with respect to both nanowires. Thus, as discussed above with reference to FIGS. 1–4, a two-dimensional nanowire crossbar may be constructed and then configured as a network of electrical components. Note also that a nanowire junction, although shown in FIGS. 4A–F to comprise the nanowire junction of two single nanowires, may also comprise a number of nanowire junctions between a number of wires in a first layer of a nanowire crossbar that together comprise a single conductive element and the nanowires in a second nanowire layer that together comprise a second conductive element.

The configurable electrical resistance of nanowire junctions is an important and special property of certain types of nanowire junctions. When certain types of molecules are used for nanowire junctions, the initially relatively high resistance of the nanowire junction may be lowered by applying a relatively large positive voltage to the nanowire junction. The resistance of the nanowire junction can be a function of the magnitude of the highest voltage applied to the nanowire junction. By applying higher and higher positive voltages to a nanowire junction, the resistance of the nanowire junction can be made lower and lower. A relatively low resistance state achieved by application of a positive voltage may be reversed by applying a sufficiently high, negative voltage. Thus, not only is the electrical resistance of a nanowire junction configurable, the electrical resistance may also be reconfigurable, depending on the type of molecules forming the nanowire junction.

Figure 5:
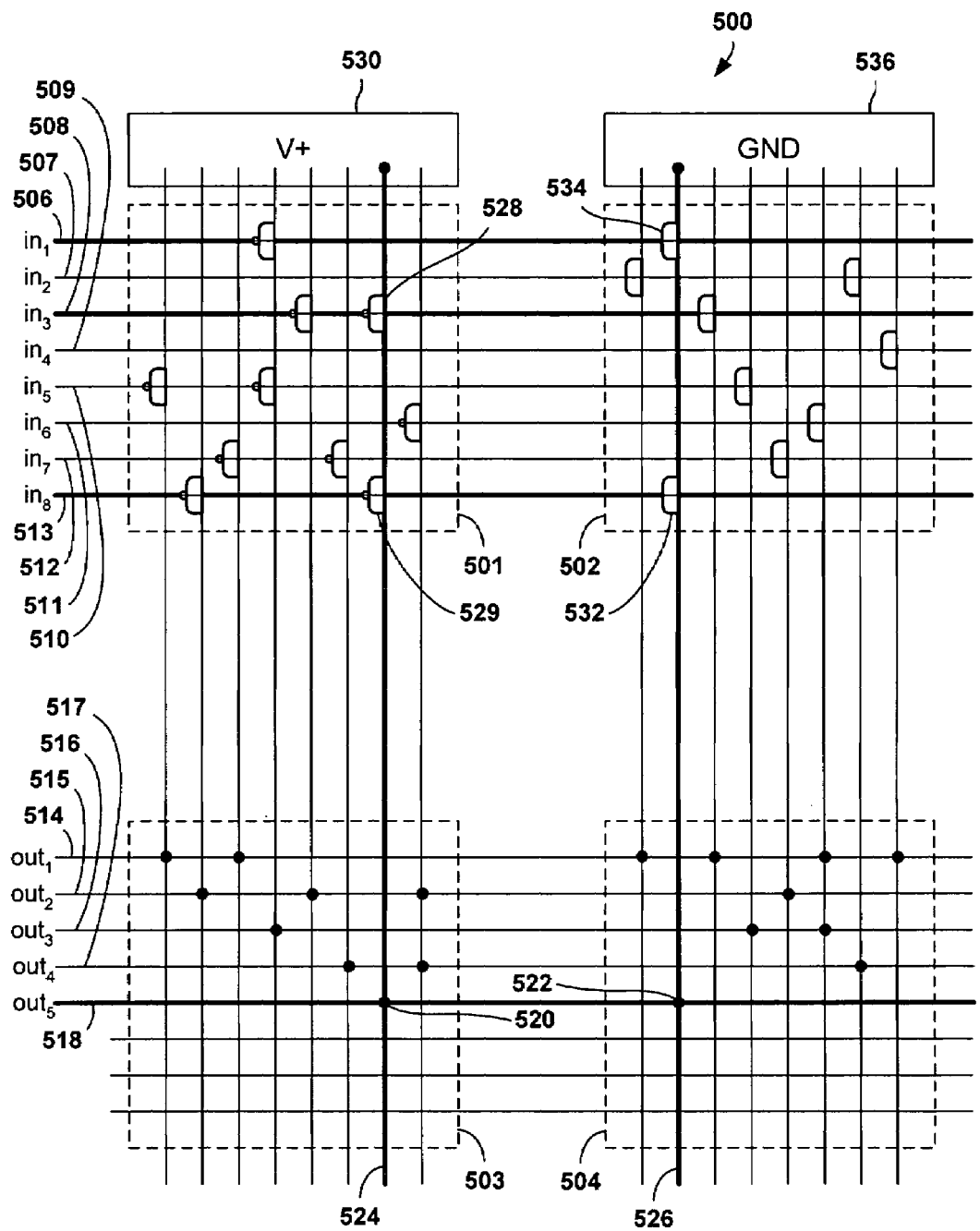
FIG. 5 illustrates an exemplary CS lattice.

A particularly useful type of nanoscale electronic component array based on nanowire-crossbar technology is referred to as a "complementary/symmetry lattice" ("CS lattice"). FIG. 5 illustrates an exemplary CS lattice. Note that, although CS lattices are generally configured to represent logical and useful circuits, the CS lattice in FIG. 5 is rather arbitrarily configured, and is shown not as a representation of a particular subcircuit implemented by the CS lattice, and may not even be useful or functional, but rather is included to show the basic features of the CS lattice itself. In general, because of the small scales of the nanowire-crossbar grids, it is difficult to chemically alter individual nanowire junctions. Techniques do exist for applying a very small number of molecules to a particular nanowire junction, but the techniques are painstakingly time consuming, and unsuitable for mass production. However, it is currently relatively straightforward to chemically alter subregions or microregions, comprising a number of nanowire junctions using currently available semiconductor manufacturing technologies. The term "microregion" is meant to indicate a scale larger than an individual nanowire junction, but not necessarily a particular range of dimensions. It is currently technically feasible to fabricate sub-micron-sized microregions, for example. In the exemplary CS lattice shown in FIG. 5, four distinct, square microregions, demarcated by dashed lines 501–504, are shown within the nanowire crossbar 500. Microregion 501 is chemically altered so that nanowire junctions within microregion 501 may be selectively configured as pFET components. Conversely, microregion 502 has been chemically altered so that nanowire junctions within microregion 502 may be selectively configured as nFET components. The microregions 503 and 504 have been chemically configured so that nanowire junctions within microregions 503 and 504 can be selectively configured as conductive links that electrically connect the nanowires forming the nanowire junctions. In certain embodiments, one set of parallel wires, the horizontal, conductive nanowires in FIG. 5, may be of nanoscale dimensions or of greater, sub-microscale or microscale dimensions, while the other set of parallel wires, the vertical semiconductive nanowires in FIG. 5, can be of nanoscale or microscale dimensions.

In a CS lattice, some number of nanowires is considered as a set of molecular input-signal lines. For example, in the CS lattice shown in FIG. 5, horizontal nanowires 506–513 are considered as inputs, and labeled "$in_1$"–"$in_8$." Similarly, a distinct set of wires is normally considered as a set of molecular output-signal lines. For example, in the CS lattice shown in FIG. 5, horizontal nanowires 514–518 are considered as molecular output-signal lines, and designated in FIG. 5 as "$out_1$"–"$out_5$." Consider, for example, molecular output-signal line, or horizontal nanowire, "$out_5$" 518. Proceeding along nanowire "$out_5$" 518 from left to right, it can be seen that molecular output-signal line "$out_5$" is connected via nanowire junction connections 520 and 522, denoted by small circles in the nanowire junctions, to vertical nanowires 524 and 526, respectively. Traversing these vertical nanowires 524 and 526, it can be seen that vertical nanowire 524 is connected with molecular input-signal line "$in_3$" 508 via a pFET 528 and connected with molecular input-signal line "$in_8$" 513 via a pFET 529. Thus, when molecular input-signal lines "$in_3$" 508 and "$in_8$" 513 are low, the pFETs 528 and 529 are activated to connect molecular output-signal line "$out_5$" with a high voltage source 530, potentially driving molecular output-signal line "$out_5$" to a high-voltage state. However, following vertical nanowire 526 upwards from the connection 522 to molecular output-signal line "$out_5$" 518, it can be seen that the vertical nanowire 526 interconnects with molecular input-signal line "$in_8$" 513 via a nFET 532 and interconnects with molecular input-signal line "$in_1$" 506 via nFET 534. Whenever molecular input-signal lines "$in_1$" and "$in_8$" are both in a high-voltage state, then the nFETs 532 and 534 are activated to interconnect the vertical nanowire 526 with ground 536, essentially shorting vertical nanowire 526 and molecular output-signal line "$out_5$" 518 to ground. When molecular input-signal lines "$in_1$" and "$in_8$" are high molecular output-signal line "$out_5$" 518 is low. When both of molecular input-signal lines "$in_1$" and "$in_8$" are low, and molecular input-signal line "$in_3$" is high, then molecular output-signal line "$out_5$" is undriven, and in a high impedance state. Thus, the state of molecular output-signal line "$out_5$" 518 depends only on the states of molecular input-signal lines "$in_1$," "$in_3$," and "$in_8$," and a truth table summarizing the response of molecular output-signal line to all possible input-signal-line-states can be provided as follows:

| $in_1$ | $in_3$ | $in_8$ | $out_5$ |
|---|---|---|---|
| 0 | 0 | 0 | 1 |
| 0 | 0 | 1 | high Z |
| 0 | 1 | 0 | high Z |
| 0 | 1 | 1 | high Z |
| 1 | 0 | 0 | 1 |
| 1 | 0 | 1 | 0 |
| 1 | 1 | 0 | high Z |
| 1 | 1 | 1 | 0 |

Various different types and sizes of CS lattices are possible. The configuration of CS lattices is constrained only by the fact that there is a minimum area of a nanowire crossbar to which discrete types of chemically modifying agents can be applied, by direct deposit, by photolithographic methods, or by other methods. Thus, CS lattices comprise blocks of sublattices, or microregions, within which one or a small number of different types of nanoscale electrical components can be selectively created at nanowire junctions.

While a brief introduction to nanowire lattices has been provided, above, more detailed information is available in a number of patent applications and issued patents. Additional information may be obtained from: Kuekes, et al., U.S. Pat. No. 6,314,019B1; Kuekes, et al., U.S. Pat. No. 6,256,767B1; Kuekes, et al., U.S. Pat. No. 6,128,214; and Snider, et al., published U.S. Patent Application No. US-2004-0041617.

Graph Theory Definitions and Terminology

The present invention employs concepts from graph theory. In this subsection, a general discussion of graphs, subgraphs, isomorphisms, and monomorphisms is provided with reference to FIGS. 6–8. The concepts introduced in this subsection are employed in the subsequent subsection discussed below.

A graph is a mathematical construct mathematically expressed as:

$$G = (V_G, E_G)$$

where $V_G$ is a finite non-empty set of nodes or vertices of G; and $E_G$ is a set of edges that form connections between pairs of nodes of G.

Figure 6A:
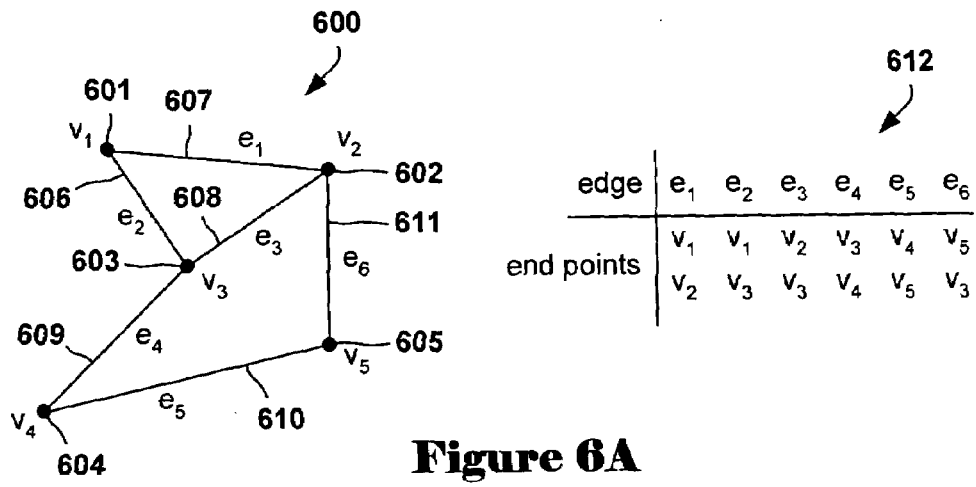
FIG. 6A illustrates an exemplary graph.

Graphs can be used to model a wide range of problems in which each node and edge has a problem-related interpretation. FIG. 6A illustrates an exemplary graph 600 and an associated table of edges and nodes 612. In FIG. 6A, each node of the exemplary graph 600 is identified by a point, such as points 601–605, and labeled by labels of the form "$v_i$," where i is an integer node index. The set of nodes of graph 600 is given by the node set $\{v_1, v_2, v_3, v_4, v_5\}$. The edges of graph 600 are identified by line segments 606–611 and are labeled by labels of the form "$e_j$," where j is an integer edge index. The set of edges of graph 600 is given by the edge set $\{e_1, e_2, e_3, e_4, e_5, e_6\}$. Each edge has a pair of associated nodes that serve as endpoints. Table 612 displays the pairs of nodes that serve as endpoints for edges 606–611. For example, in table 612, nodes $v_3$ and $v_5$ are endpoints for edge $e_6$.

A subgraph is a mathematical construct mathematically expressed as:

Graph G'=(V', E') is a subgraph of G=(V, E) if and only if

V'⊆V, and

E'⊆E such that for all $v_1$, $v_2 \in V'$, if e∈E and $v_1$ and $v_2$ are endpoints of e, then e∈E'.

Figure 6B:
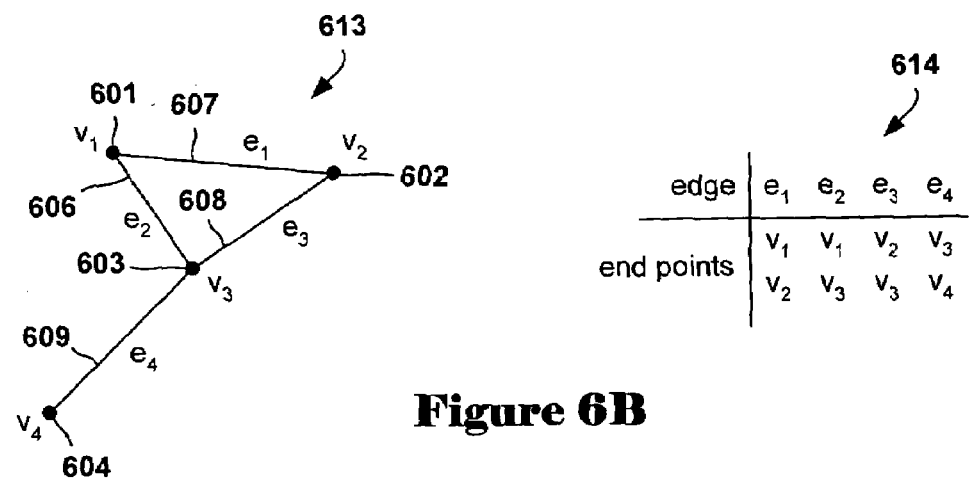
FIGS. 6B–C illustrate one of many possible subgraphs of the exemplary graph shown in FIG. 6A.
Figure 6C:
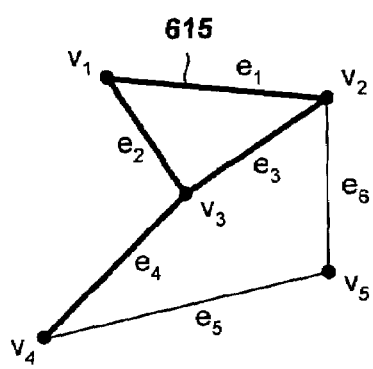

Note that, in general, a subgraph need not include all possible edges between a pair of nodes in V'. In other words, a subgraph G' is a graph located entirely within a larger graph G. FIG. 6B illustrates one of many possible subgraphs 613 of graph 600, shown in FIG. 6A, and an associated subgraph table of edges and endpoints 614. In FIG. 6B, subgraph 613 is identified by nodes 601–604 that together compose the node set $\{v_1, v_2, v_3, v_4\}$, and edges 606–609 that together compose the edge set $\{e_1, e_2, e_3, e_4\}$. Note that the node set and edge set of subgraph 613 are subsets of the node set and edge set of graph 600, respectively. Note also that the endpoints of each edge in the edge set of subgraph 613 are elements in the node set of subgraph 613. Table 614 displays the pairs of nodes that serve as endpoints for subgraph 613 and can be obtained by deleting from table 612, shown in FIG. 6A, each column that does not correspond to an edge in subgraph 613. In FIG. 6C, bold edges, such as bold edge 615, identify subgraph 613, shown in FIG. 6B, as a graph located entirely within graph 600, shown in FIG. 6A.

Typically, the shape, length and position in space of graph edges are not part of a graph's specification. In other words, a graph may have many different possible structurally equivalent spatial representations. Graph matching is the process of determining a mapping between two graphs that establishes a correspondence between the nodes and edges of one graph and the nodes and edges of a second graph that reflects the structural equivalence of the two graphs. The three types of graph matching relevant to the description of the present invention are isomorphism, subgraph isomorphism, and, in particular, monomorphism.

Figure 7A:
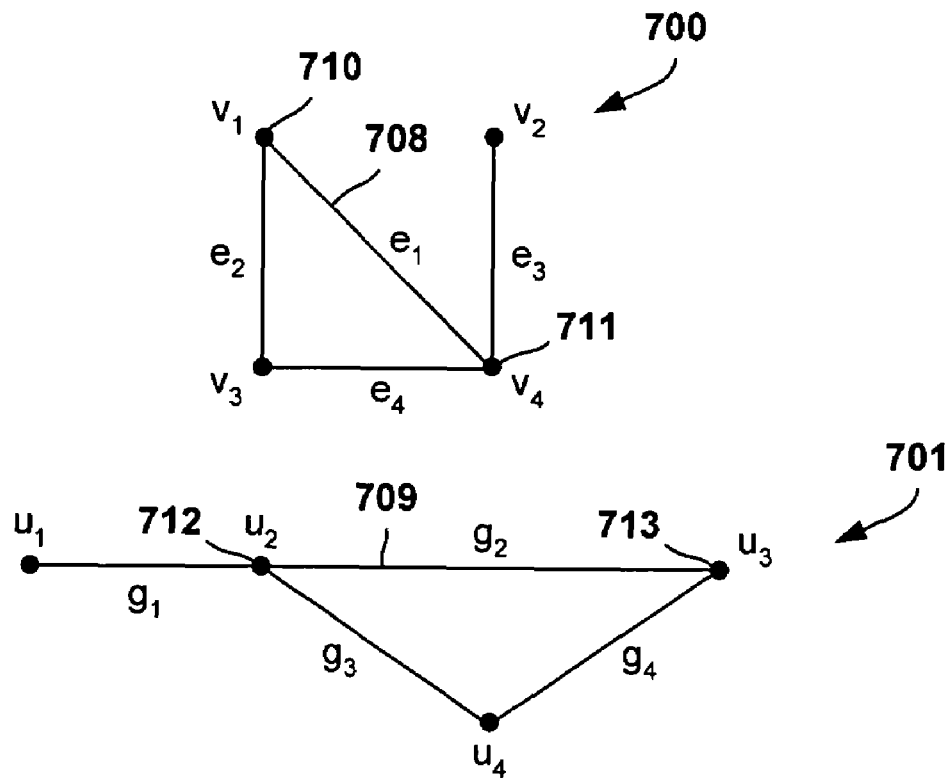
FIG. 7A illustrates two exemplary isomorphic graphs.

Two graphs having different structurally equivalent spatial representations and an identical number of nodes and edges and an identical pattern of node and edge connections are called "isomorphic graphs." FIG. 7A illustrates two isomorphic graphs. In FIG. 7A, graphs 700 and 701 are structurally equivalent, but graphs 700 and 701 have two different spatial representations. For example, both graphs 700 and 701 are composed of closed triangles defined by three nodes and three edges, and an edge extending from one of the triangle nodes. In other words, both graphs 700 and 701 are isomorphic. However, the orientation of the closed triangle and extended edge of graph 700 is different from the orientation of the closed triangle and extended edge of graph 701.

Mathematically, two graphs G and H are isomorphic if there exist a mapping, called an "isomorphism," denoted by $f:G \to H$, such that $f$ is a pair of functions $f_V$, $f_E$) given by:

$f_V: V_G \to V_H$, and $f_E: E_G \to E_H$.

For every edge e in the set $E_G$, the function $f_V$ maps the endpoints of edge e to endpoints of edge $f_E(e)$. In other words, if nodes $v_i$ and $v_j$ are endpoints of edge e, then $f_V(v_i)$ and $f_V(v_j)$ are endpoints of $f_E(e)$. Moreover, the pair of functions $(f_V, f_E)$ are both one-to-one and onto. A function $f: A \to B$ that maps the elements of a set A to the elements in a set B is one-to-one, if, for every x and y in A, with x≠y, $f(x) \neq f(y)$. A function $f: A \to B$ is onto if, for every b in B, there exists at least one a in A such that $f(a)=b$.

Figure 7B:
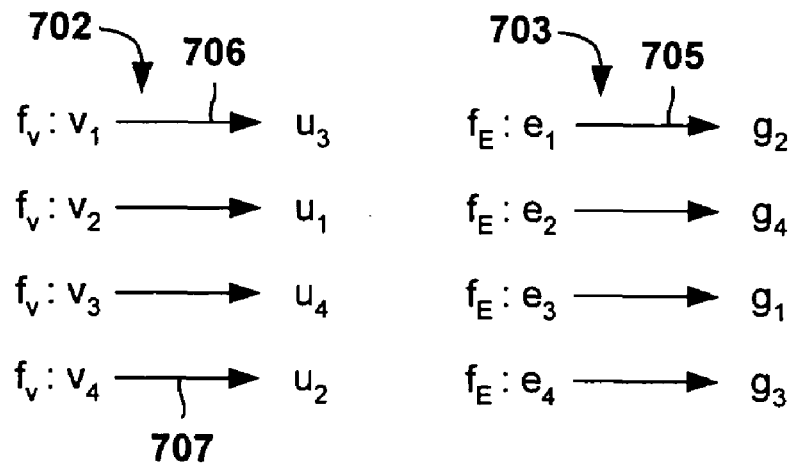
FIG. 7B shows a graph isomorphism associated with the exemplary graphs shown in FIG. 7A.

FIG. 7B shows a isomorphism between the nodes and edges of graphs 700 and 701, shown in FIG. 7A. In FIG. 7B, the arrows in column 702 represent node function $f_V$ that maps the nodes of graph 700 to the nodes of graph 701, and the arrows in column 703 represent an edge function $f_E$ that maps the edges of graph 700 to the edges of graph 701. For each node and edge in graph 700, there is one unique corresponding node and edge in graph 701, and the isomorphism preserves the nodes associated with each edge. For example, mapping 705 maps edge $e_1$ 708 to edge $g_2$ 709, and mapping 706 maps node $v_1$ 710 to node $u_3$ 713, and mapping 707 maps node $v_4$ 711 to node $u_2$ 712. Note that node mappings 706 and 707 preserve the nodes associated with each edge mapped by edge mapping 705.

The monomorphism, however, retains the one-to-one requirement but relaxes the onto requirement. Mathematically, two graphs G and H are said to be "monomorphic" if there exists a mapping, called a "monomorphism," denoted by $h:G \to H$, such that h is a pair of functions given by:

$h_V: V_G \to V_H$, and $h_E: E_G \to E_H$ where $(h_V, h_E)$ are one-to-one mappings.

Figure 8A:
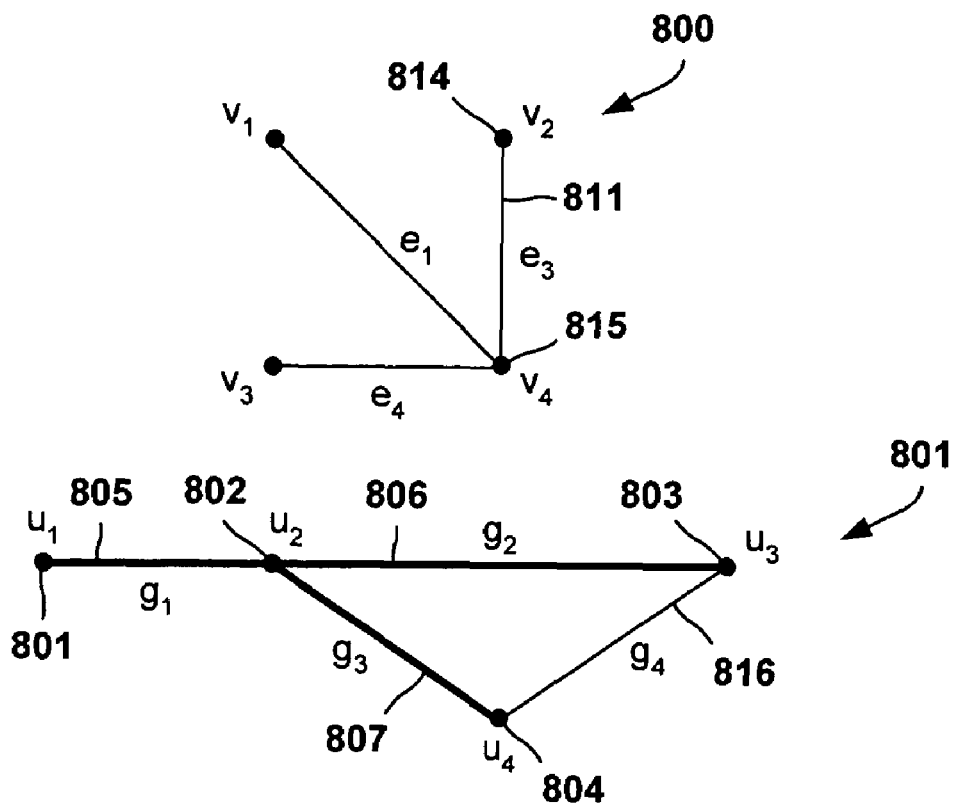
FIG. 8A illustrates a graph and a graph monomorphism.
Figure 8B:
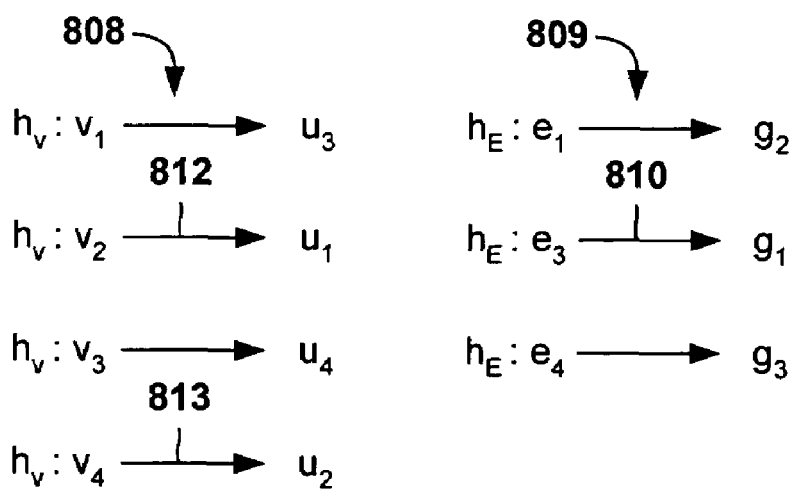
FIG. 8B shows a monomorphism associated with the exemplary graphs shown in FIG. 8A.

FIGS. 8A–B illustrate the concept of a monomorphism. FIG. 8A illustrates a graph that is monomorphic to a set of nodes and edges of a larger graph. In FIG. 8A, graph 800 is monomorphic to the node set identified by bold nodes 801–804 and the edge set identified by bold edges 805–807. FIG. 8B shows the monomorphism that maps the nodes and edges in graph 800 to the corresponding nodes and edges of graph 801. Arrows in column 808 identify the node function $h_V$, and the arrows in column 809 identify the edge function $h_E$. Note that the monomorphism identified in columns 808 and 809 preserves the endpoints associated with each edge. For example, mapping 810 maps edge $e_3$ 811 to edge $g_1$ 805, and mappings 812 and 813 preserve the endpoints associated with edge $e_3$ 811 by mapping node $v_2$ 814 to node $u_1$ 801 and mapping node $v_4$ 815 to node $u_2$ 802, respectively.

Note that, by removing the onto requirement from the monomorphism, every node and edge of a graph G can be mapped to a subset of nodes and a subset of edges of a graph H, but not every node nor every edge of graph H corresponds to a node or edge of graph G. For example, in FIG. 8A–8B, every node and edge of graph 800 has a corresponding node and edge in graph 801 (one-to-one), but edge 816 in graph 801 does not have a corresponding edge in graph 800 (not onto). The subset of nodes and edges of a graph that is monomorphic to another graph, such as those identified by bold nodes 801–804 and bold edges 805–807 of graph 801, is called a "graph monomorphism." Methods for determining monomorphisms and graph monomorphisms are well-known in the art. See e.g., *VF Graph Matching Library*, SIVA Lab, University of Naples "Federico II;" "An Improved Algorithm for Matching Large Graphs," L. P. Cordella, P. Foggia, C. Sansone, M. Vento, Dipartimento di Informatica e Sistemistica, Universita degli Studi di Napoli "Federico II," Via Claudio, 21-80123 Napoli, Italy; "A Graph-Decomposition Algorithm for Graph Optimal Monomorphism," Yasser El-Sonbaty, M. A. Ismail, Dept. of Elect. And Computer Engineering, Arab Academy of Science and Technology, Alexandria 1029, Egypt.

Note that a graph monomorphism is not an induced subgraph. An induced subgraph of a graph G is a subset of nodes, denoted by U, of $V_G$ and any edges in $E_G$ whose endpoints are in U. In FIG. 8A, for graph 801, the induced subgraph on the node set, $U=\{u_1, u_2, u_5, u_4\}$, is the set of all of the edges $\{g_1, g_2, g_3, g_4\}$. By contrast, the graph monomorphism, identified by bold nodes 801–804 and bold edges 805–807, has the edge set $\{g_1, g_2, g_3\}$ and does not include all of the edges that have endpoints in U. In other words, the graph monomorphism identified by bold nodes 801–804 and bold edges 805–807 and the induced subgraph on the node set U of graph 801 are not identical graphs.

Embodiments of the Present Invention

Various embodiments of the present invention are directed to methods for implementing circuits on nanowire crossbars having one or more randomly distributed non-functional nanowire junctions. The methods are subject to constraints, such as ensuring that the nanowires used to input signals and output signals from the nanowire crossbar are compatible with other interconnected electronic devices and preserve nanowire junction polarity. Implementing a circuit on a nanowire crossbar involves allocating one or more functional nanowire junctions within each microregion, as described below with reference to FIGS. 9–10.

Figure 9A:
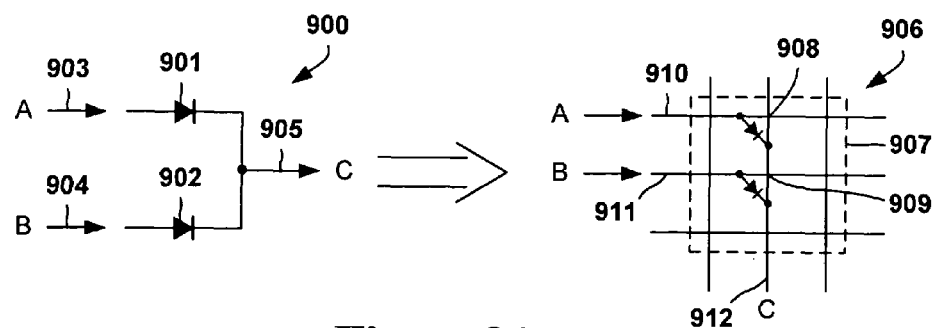
FIGS. 9–10 illustrate examples of allocating nanowire junctions to implement example circuits.
Figure 9B:
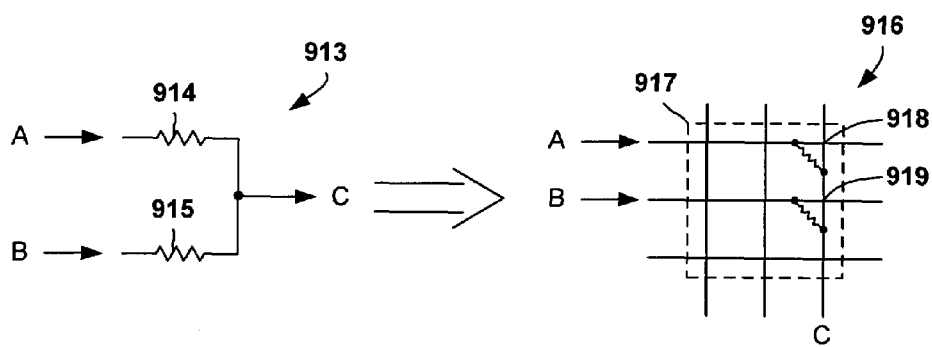
Figure 10:
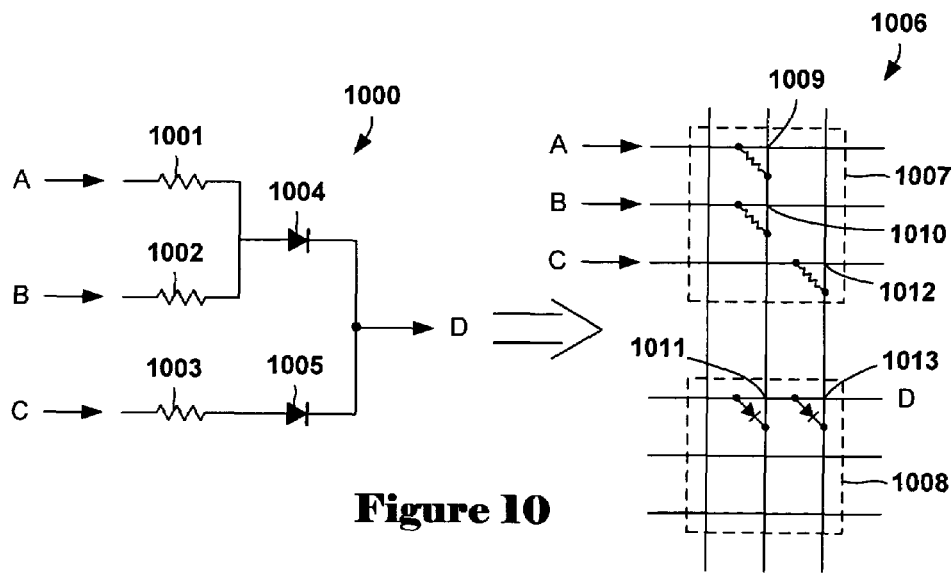

FIGS. 9–10 illustrate example allocations of nanowire junctions of nanowire crossbars to implement circuits. In FIG. 9A, circuit 900 is composed of two identical diode components 901 and 902. Arrows 903 and 904 identify input signals A and B that pass through diodes 901 and 902, respectively, and are shorted together to give output signal C, identified by arrow 905. Nanowire crossbar 906 shows one of many possible allocations of nanowire junctions that can be used to implement circuit 900. In nanowire crossbar 906, microregion 907 is chemically altered so that nanowire junctions within microregion 907 may be selectively configured as diode nanowire junctions. Nanowire junctions 908 and 909 are allocated to implement circuit graph 900 by configuring diode components at nanowire junctions 908 and 909. Input signals A and B are delivered on horizontal nanowires 910 and 911, pass through diode-nanowire junctions 908 and 909, respectively, and are shorted together on vertical nanowire 912 to give output signal C. A nanowire crossbar, such as nanowire crossbar 906, may be part of a larger assemblage of microregions that implements either an "AND" or "OR" gate using resistor logic.

In FIG. 9B, circuit 913 is composed of two identical resistor components 914 and 915 and is implemented on nanowire crossbar 916. Microregion 917 is chemically altered so that nanowire junctions within microregion 917 may be selectively configured as resistor-nanowire junctions. In order to implement circuit 913, resistors are configured at nanowire junctions 918 and 919. A nanowire crossbar, such as nanowire crossbar 916, may be part of a larger analog circuit that is used to implement a summing or averaging function.

FIG. 10 illustrates an example implementation of a circuit containing two types of components by allocating nanowire junctions in a nanowire crossbar having two different microregions. In FIG. 10, input signals A, B, and C enter circuit 1000 on three separate circuit wires and pass through resistor components 1001–1003, respectively. The signal outputs from resistor components 1001 and 1002 are shorted together to give a signal that passes through diode component 1004, and the signal output from resistor component 1003 passes through diode component 1005. The signal outputs from resistor components 1004 and 1005 are shorted together to output signal D. Nanowire crossbar 1006 shows one of many possible allocations of nanowire junctions used to implement circuit 1000. Microregion 1007 is chemically altered so that nanowire junctions within microregion 1007 may be selectively configured as resistors, and microregion 1008 is chemically altered so that nanowire junctions within microregion 1008 may be selectively configured as diodes. Nanowire junctions 1009–1011 are allocated to implement resistor components 1001 and 1002 and diode component 1004, respectively, by configuring resistors at nanowire junctions 1009 and 1010 and configuring a diode at nanowire junction 1011. Nanowire junctions 1012 and 1013 are allocated to implement resistor component 1003 and diode component 1005 by configuring a resistor at nanowire junction 1012 and a diode at nanowire junction 1013.

Figure 11:
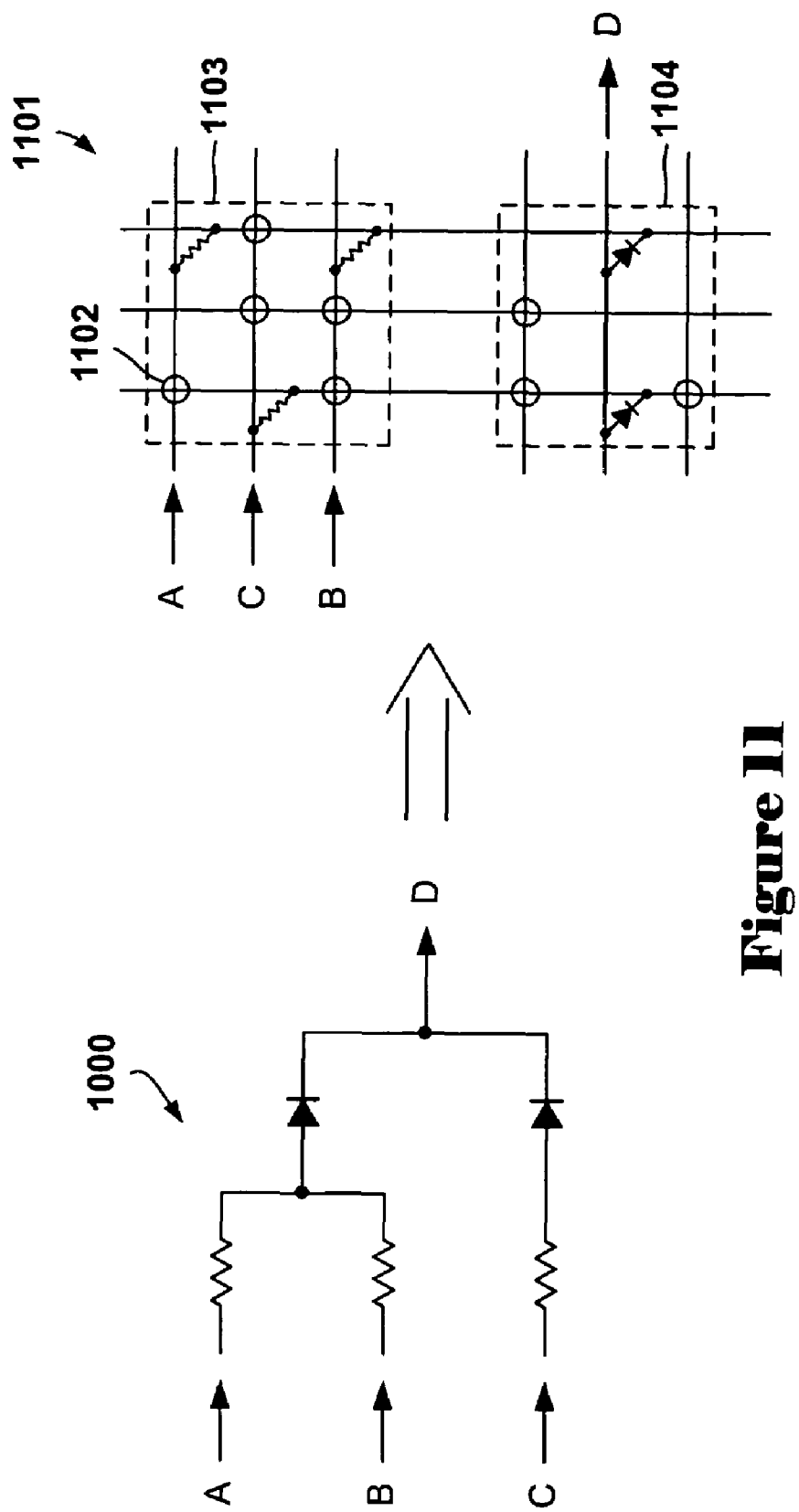
FIG. 11 illustrates an allocation of nanowire junctions in a nanowire crossbar having non-functional nanowire junctions.

FIGS. 9–10 illustrate examples of straightforward implementations of circuits on ideal, hypothetical nanowire crossbars that are free of non-functional nanowire junctions. However, in real life, implementing a circuit on a nanowire crossbar having non-functional nanowire junctions may be either technically more difficult, economically infeasible, or both. In such cases, non-functional nanowire junctions that are not available for use in the nanowire crossbar need to be taken into account when allocating nanowire junctions. FIG. 11 illustrates an allocation of nanowire junctions in a nanowire crossbar having non-functional nanowire junctions. In FIG. 11, circuit 1000, described above with reference to FIG. 10, is allocated on nanowire crossbar 1101. However, nanowire crossbar 1101 contains non-functional nanowire junctions identified by open circles, such as open circle 1102. In nanowire crossbar 1101, microregion 1103 is chemically altered so that nanowire junctions within microregion 1103 may be selectively configured as resistors, and microregion 1104 is chemically altered so that nanowire junction with microregion 1104 may be selectively configured as diodes. Note that the allocation of nanowire junctions in nanowire crossbar 1101 is different from the allocation of nanowire junctions in nanowire crossbar 1006, as describe above with reference to FIG. 10.

Note that implementing a circuit by allocating nanowire junctions in a nanowire crossbar is not to be confused with routing signals through nanowire junctions. Allocation is the apportioning of nanowire junctions for a specific purpose, and routing is determining a path or course signals travel through a nanowire crossbar. Typical routing methods take into consideration the nanowires dedicated to input signals and output signals but often fail to take into consideration the internal structure of the circuit, such distinguishing nanowire junctions used is the circuit. The method of the present invention is not a routing method because the internal structure of the circuit is preserved in allocating nanowire junctions of a nanowire crossbar.

Figure 12:
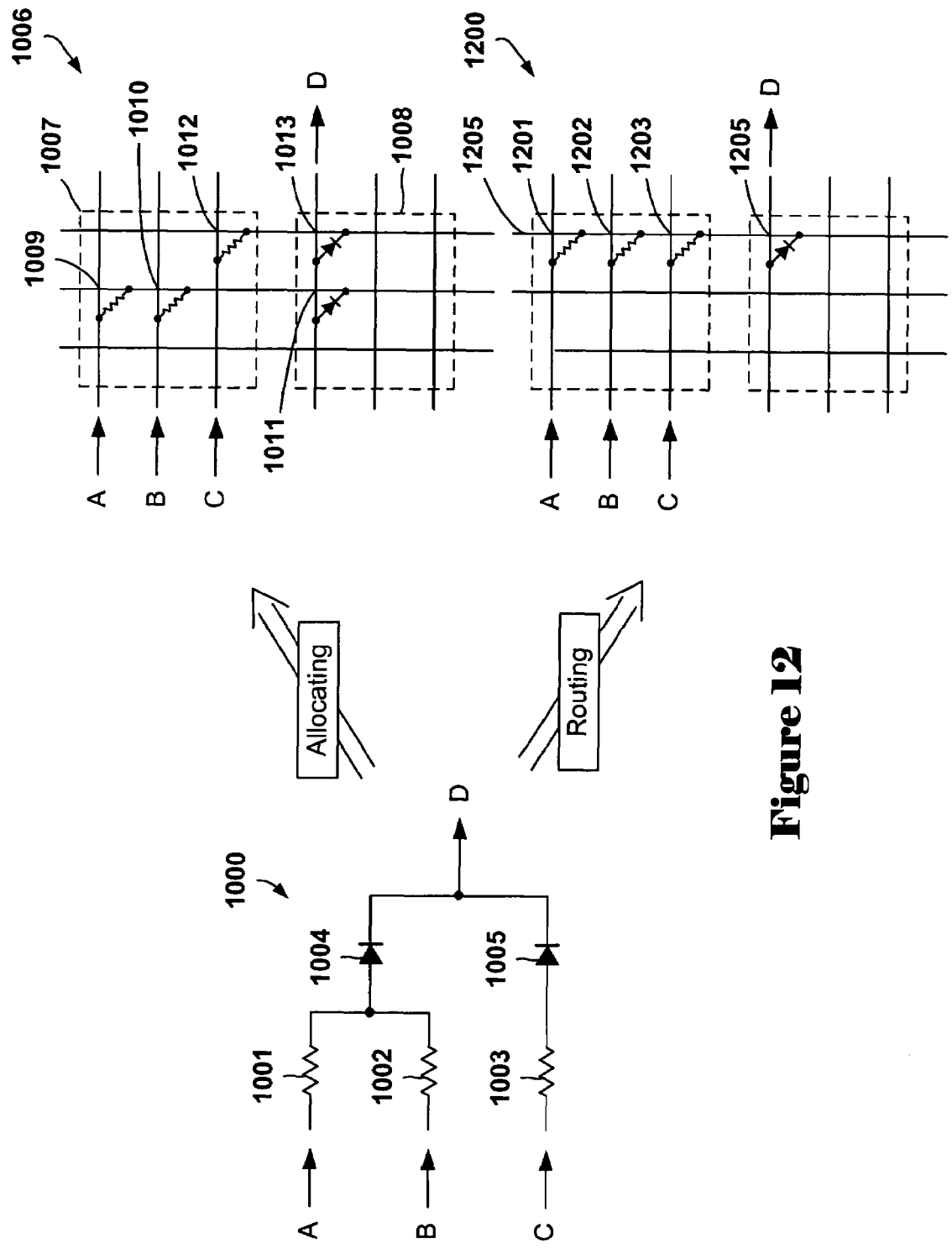
FIG. 12 illustrates contrasting allocation of nanowire junctions with routing signals through nanowire junctions.

FIG. 12 illustrates the difference between allocating nanowire junctions and routing signals through nanowire junctions according to a circuit. In FIG. 12, circuit 1000 and nanowire crossbar 1006 convert input signals A, B, and C into a single output signal D, as described above with reference to FIG. 10. Nanowire crossbar 1200 represents a hypothetical routing of nanowire junctions used to implement circuit 1000. Note that allocating nanowire junctions according to nanowire crossbar 1006 preserves the signal paths specified in circuit 1000. For example, input signals A, B, and C enter on thee separate horizontal nanowires and pass through three separate resistor-nanowire junctions 1009, 1010, and 1012 which respectively coincide with resistor components 1001–1003. The signals output from resistor-nanowire junctions 1009 and 1010 are shorted together to give a signal that passes through diode-nanowire junction 1011 which coincides with diode component 1004. The signal output from resistor-nanowire junction 1012 passes through diode-nanowire junction 1013 which coincides with diode component 1005. The signals output from diode-nanowire junctions 1011 and 1013 are shorted together to give output signal D. By contrast, the hypothetical routing given in nanowire crossbar 1202 gives a different output signal because nanowire crossbar 1200 does not preserve the internal structure of the circuit 1000. Note that all three signal inputs A, B, and C enter nanowire crossbar 1200 on different nanowires and pass through three separate resistor-nanowire junctions 1201–1203, as is required by circuit 1000. However, the signals output from resistor-nanowire junctions 1201–1203 are shorted together on a single nanowire 1204 and pass through single diode-nanowire junction 1205 to give output signal D'.

The methods of the present invention construct graphical representations of the circuit and the nanowire crossbar. A graphical representation of a circuit is called a "circuit graph," and a graphical representation of a nanowire crossbar is called a "crossbar graph." The following discussion and accompanying FIGS. 13–15 describe constructing a circuit graph based on a circuit and constructing crossbar graphs based on nanowire crossbars.

Figure 13:
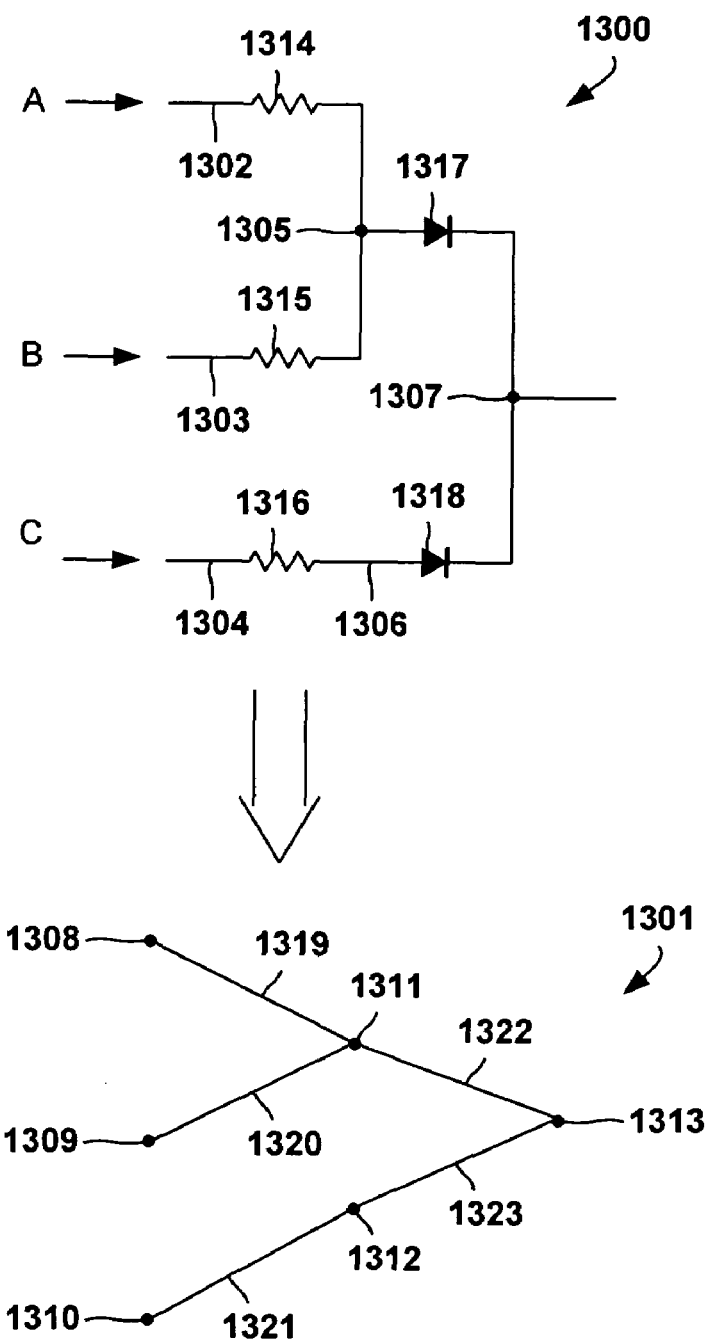
FIG. 13 illustrates one of many possible embodiments for constructing a circuit graph based on a circuit.

A circuit-graph representation of a circuit can be constructed by representing each circuit wire by a circuit-graph node and representing each circuit component by a circuit-graph edge. FIG. 13 illustrates an example of one of many possible embodiments for constructing a circuit-graph representation of a circuit. In FIG. 13, circuit 1300 is graphically represented by circuit graph 1301. For example, circuit wires 1302–1307 are represented by circuit-graph nodes 1308–1313, respectively, and circuit components 1314–1317 are represented by circuit-graph edges 1319–1323, respectively.

Figure 14:
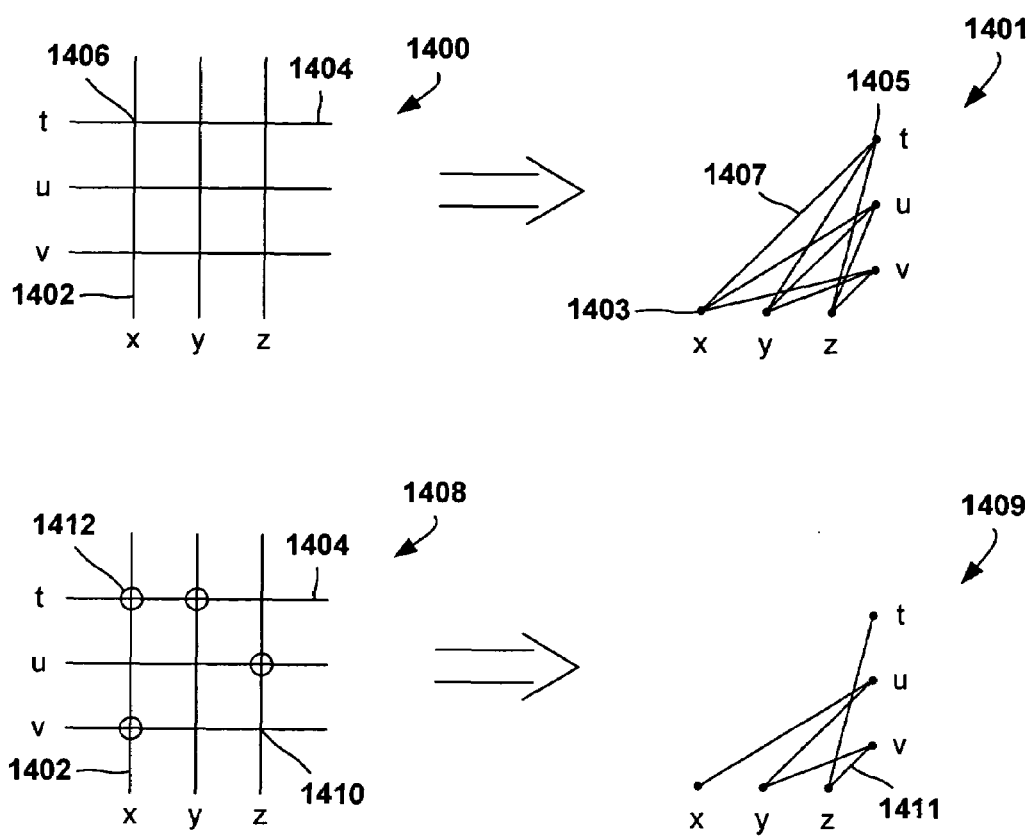
FIG. 14 illustrates one of many possible embodiments for constructing crossbar graphs that represent nanowire crossbars having a single microregion.
Figure 15:
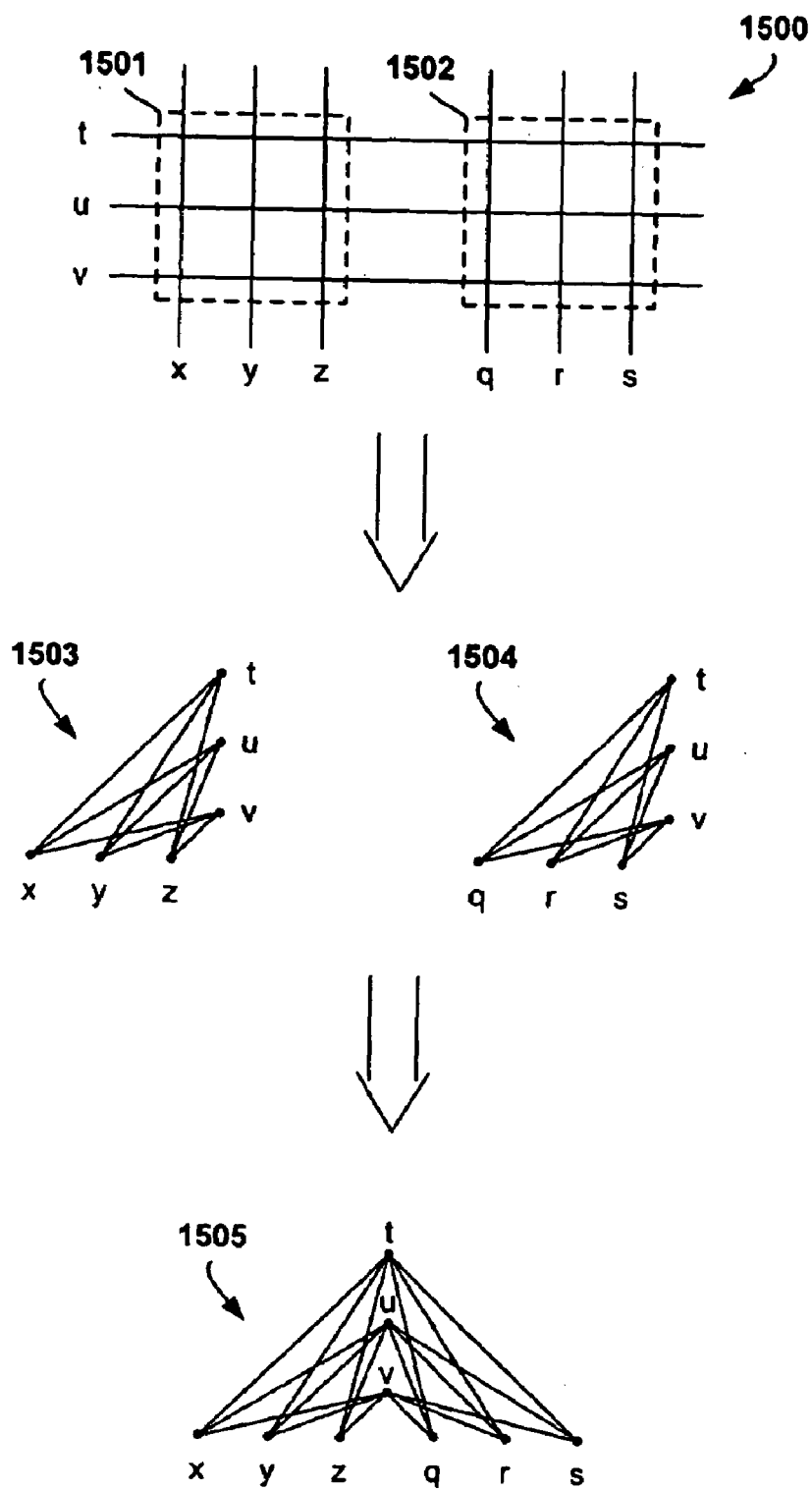
FIG. 15 illustrates one of many possible embodiments for constructing a crossbar-graph representation of a nanowire crossbar having two or more microregions.

A crossbar graph can be constructed by representing each nanowire-crossbar nanowire by a crossbar-graph node and representing each functional nanowire junction by a crossbar-graph edge. FIGS. 14–15 illustrate examples of one of many possible embodiments for constructing crossbar graphs that represent nanowire crossbars. FIG. 14 illustrates constructing crossbar graphs of nanowire crossbars composed of a single microregion. In FIG. 14 and in subsequent crossbar graphs, crossbar-graph nodes that represent vertical nanowires are arranged in a horizontal row, and crossbar-graph nodes that represent horizontal nanowires are arranged in a vertical row. Note that the methods of the present invention are not restricted to this convention for representing functional nanowire junctions and nanowires. Nanowire crossbar 1400 is graphically represented by nanowire-crossbar graph 1401. Note that both the crossbar-graph nodes and nanowire-crossbar nanowires are correspondingly labeled. Vertical nanowires, labeled x, y, and z, are represented by horizontally arranged, correspondingly labeled crossbar-graph nodes. For example, vertical nanowire 1402 is represented by crossbar-graph node 1403. Horizontal nanowires, labeled t, u, and v, are represented by vertically arranged, correspondingly labeled crossbar-graph nodes. For example, horizontal nanowire 1404 is represented by crossbar-graph node 1405. Each functional nanowire junction in the nanowire crossbar 1400 is represented by a crossbar-graph edge in the nanowire-crossbar graph 1401. For example, functional nanowire junction 1406 is represented by crossbar-graph edge 1407. However, non-functional nanowire junctions are not represented in the crossbar graph. For example, nanowire crossbar 1408 has four non-functional nanowire junctions. Although, functional nanowire junction 1410 is represented by crossbar-graph edge 1411, non-function nanowire junction 1412 is not represented in crossbar graph 1409.

Graphical representations of nanowire crossbars having two or more microregions can be constructed by first constructing a crossbar graph for each microregion, as described above with reference to FIG. 14, and then merge crossbar-graph nodes that represent identical nanowires. FIG. 15 illustrates one of many possible embodiments for constructing a crossbar-graph representation of a nanowire crossbar having two or more microregions. In FIG. 15, nanowire crossbar 1500 is composed of two microregions 1501 and 1502. Crossbar graph 1503 is constructed to represent microregion 1501, and crossbar graph 1504 is constructed to represent microregion 1502, as described above with reference to FIG. 14. Identical crossbar-graph nodes in crossbar graphs 1503 and 1504, labeled t, u, and v, can be merged to give crossbar graph 1505.

Figure 16:
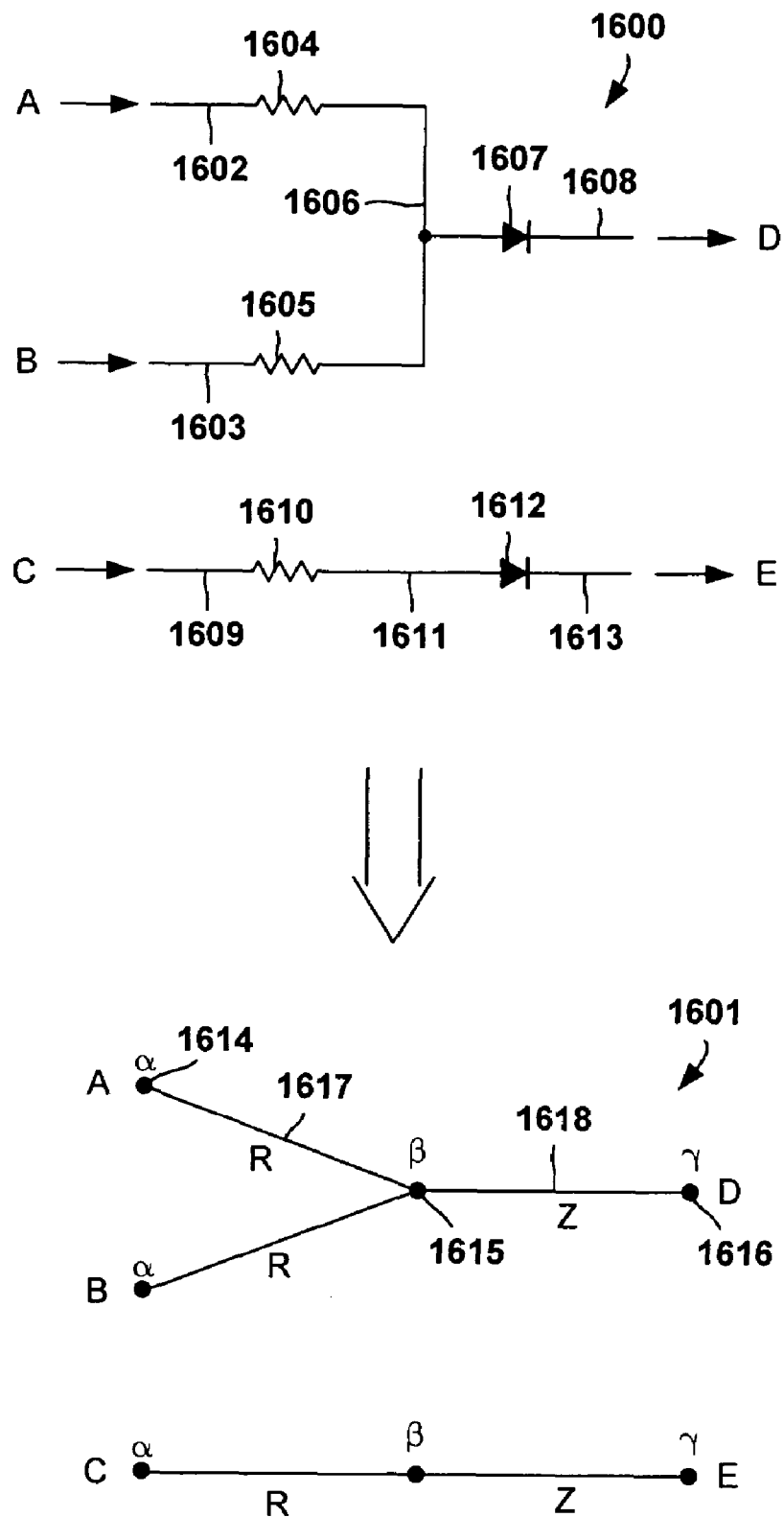
FIG. 16 illustrates a graphical representation of a hypothetical circuit.
Figure 17:
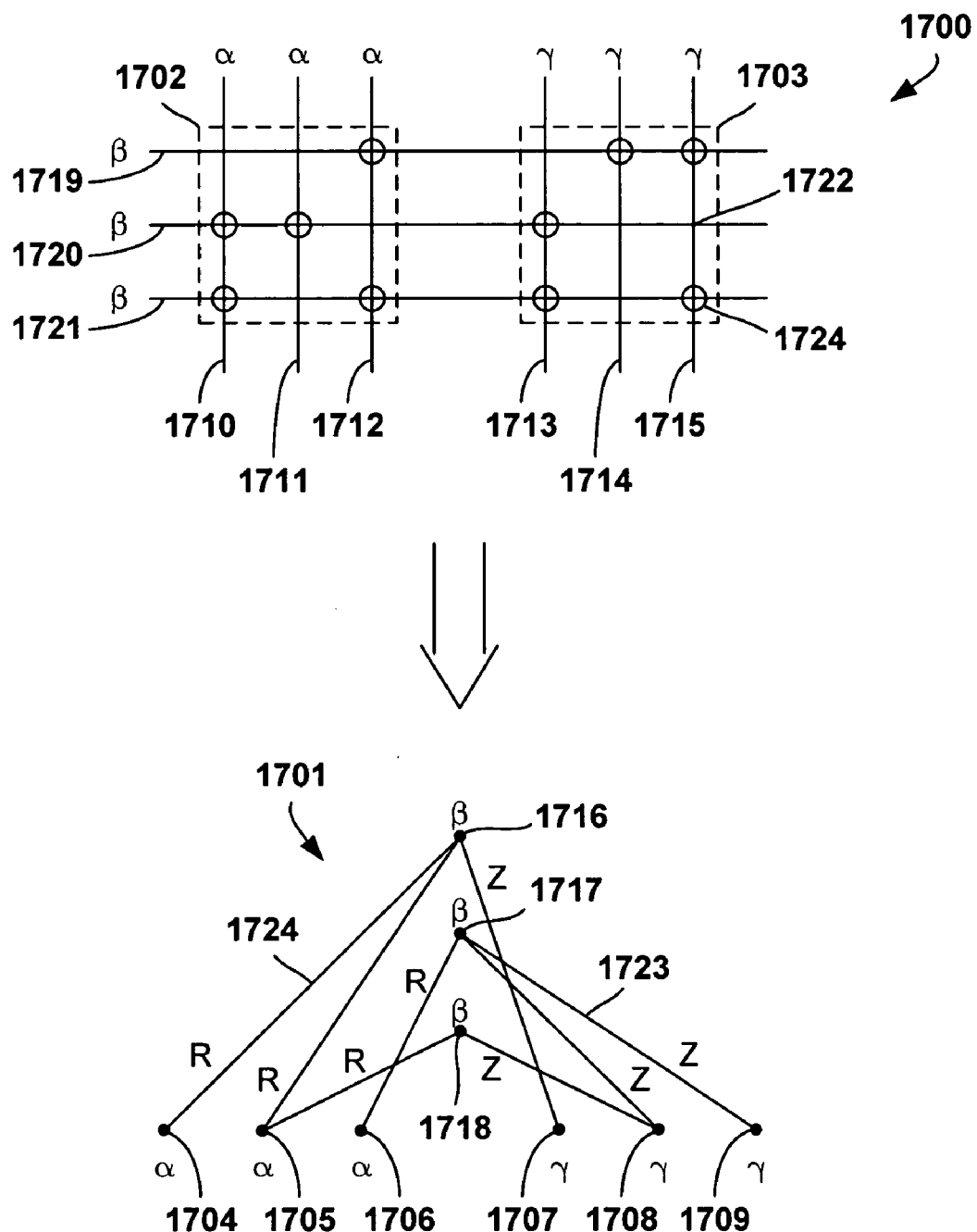
FIG. 17 illustrates a graphical representation of a hypothetical nanowire crossbar.
Figure 18:
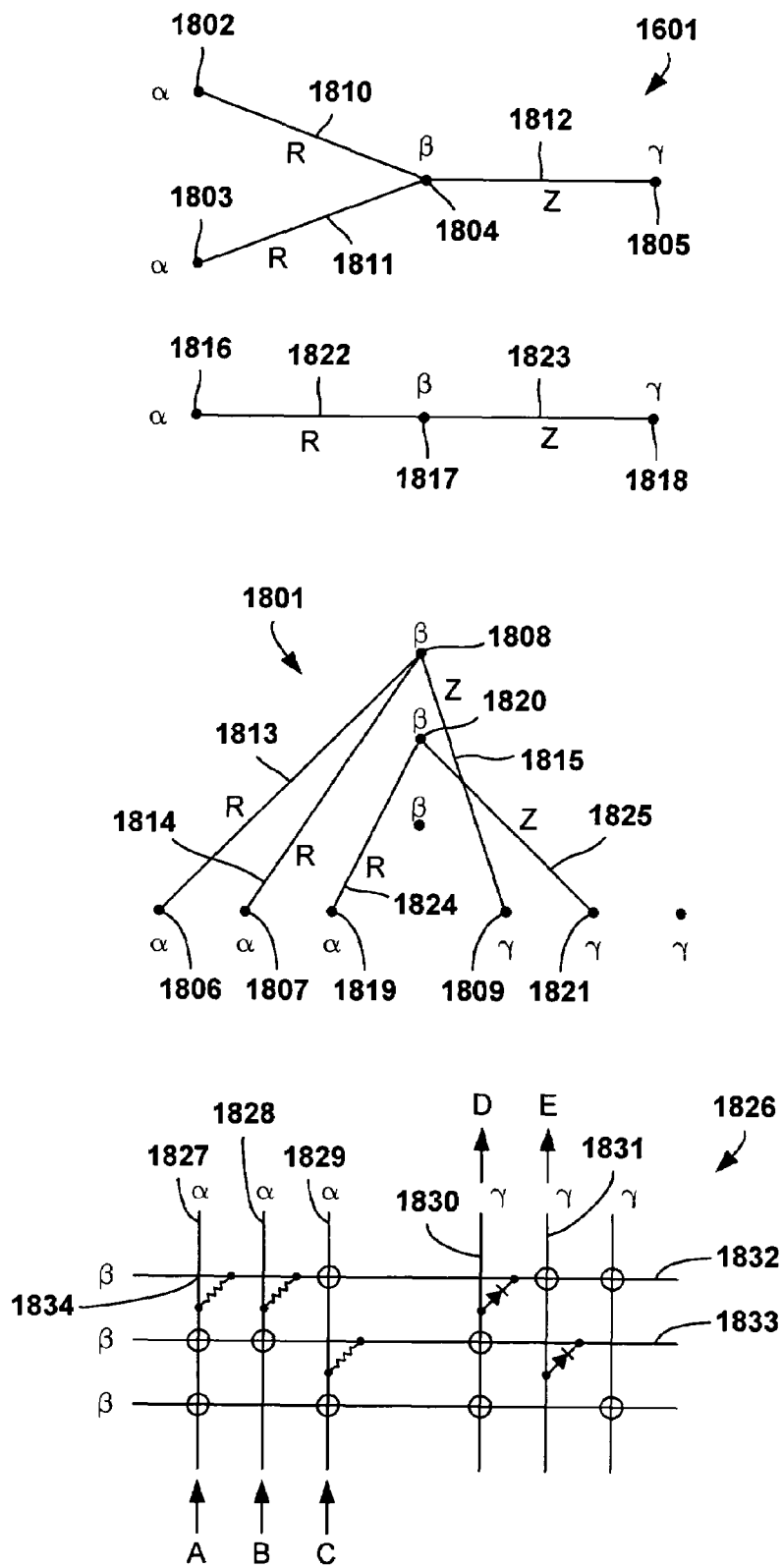
FIG. 18 illustrates the results obtained from a hypothetical search for a graph monomorphism.

The following discussion and accompanying FIGS. 16–18 presents an example application of the methods of the present invention. A hypothetical circuit, shown in FIG. 16, is implemented on a hypothetical nanowire crossbar having one or more randomly distributed non-functional nanowire junctions, shown in FIG. 17.

First, a circuit graph is constructed to represent the circuit, and a crossbar graph is constructed to represent the nanowire crossbar. FIG. 16 illustrates a graphical representation of a hypothetical circuit 1600. Circuit 1600 is composed of a "first subcircuit" and a "second subcircuit." The first subcircuit is composed of circuit wires 1602 and 1603, resistor components 1604 and 1605, circuit wire 1606, diode component 1607, and circuit wire 1608. The second subcircuit is composed of circuit wire 1609, resistor component 1610, circuit wire 1611, diode component 1612, and circuit wire 1613. The first subcircuit converts input signals A and B into output signal D and the second subcircuit converts input signal C into output signal E. Circuit graph 1601 is constructed as described above with reference to FIGS. 13. Each circuit-graph node represents a circuit wire, and each circuit-graph edge represents a circuit component. For example, circuit-graph nodes 1614–1616 represent circuit wires 1602, 1606, and 1608, respectively, and circuit-graph edges 1617 and 1618 represent resistor component 1604 and diode component 1607, respectively.

FIG. 17 illustrates a graphical representation of a hypothetical nanowire crossbar that is intended to implement the circuit described above with reference to FIG. 16. In FIG. 17, nanowire crossbar 1700 is composed of microregions 1702 and 1703. Microregion 1702 is chemical altered to form resistor-nanowire junctions, and microregion 1703 is chemically altered to form diode-nanowire junctions. Crossbar graph 1701 is constructed as described above with reference to FIGS. 14–15. Each crossbar-graph node represents a nanowire-crossbar nanowire, and each crossbar-graph edge represents functional nanowire junction. Crossbar-graph nodes 1704–1709 represent vertical nanowires 1710–1715, respectively, and crossbar-graph nodes 1716–1718 represent horizontal nanowires 1719–1721, respectively. Functional nanowire junctions are represented by crossbar-graph edges. For example, functional nanowire junction 1722 is represented by crossbar-graph edge 1723.

Note that non-functional nanowire junctions, such non-functional nanowire junction 1724, are not represented in crossbar graph 1701.

After the circuit graph and crossbar graph are constructed, the nodes and edges of the circuit graph and crossbar graph are annotated. Edge annotations are used to identify the functionality of the corresponding component. For example, in circuit graph 1601, shown in FIG. 16, circuit-graph edges that represent resistor components, such as circuit-graph edge 1617, are annotated with the letter R, and circuit-graph edges that represent diode components, such as circuit-graph edge 1618, are annotated with the letter Z. In crossbar graph 1701, shown in FIG. 17, crossbar-graph edges that represent functional nanowire junctions that can be configured as resistor-nanowire junctions, such as crossbar-graph edge 1725, are annotated with the letter R, and crossbar graph edges that represent functional nanowire junctions that can be configured as diode-nanowire junctions, such as crossbar-graph edge 1723, are annotated with the letter Z. Node annotations can be used to constrain node matching between different circuit graphs and different crossbar graphs. Node annotations ensure that input/output constraints are enforced between a circuit and other circuitry that has been, or may be, mapped to other areas of a larger nanowire crossbar graph. Also, node annotations preserve directionality constraints on asymmetric nanowire junctions, such as diodes, that must have, for example, an input delivered on a horizontal wire and an output driven on a vertical wire. For example, in FIGS. 16–17, the letter $\alpha$ annotates nodes that represent nanowires used to deliver input signals A, B, and C, the letter $\beta$ annotates nodes that represent nanowires used to drive signal through the nanowire crossbar, and the letter $\gamma$ annotates nodes that represent nanowires used to carry output signals D and E.

After the circuit graph and the nanowire-crossbar graph have been annotated, the method searches for a monomorphism between the circuit graph and a subgraph of the crossbar graph, or the method determines that no such monomorphism exists. Determining a graph monomorphism is subject to the constraints that node and edge annotations must match. In other words, circuit-graph nodes are matched with crossbar-graph nodes if both nodes have identical node annotations or both have no annotations. For example, in FIG. 16, circuit-graph nodes annotated with the letter $\alpha$, such as circuit-graph node 1614, must be matched with a crossbar-graph node labeled with the identical letter annotation $\alpha$ in the crossbar graph 1701, such as crossbar-graph node 1704. Similarly, circuit-graph edges are matched with crossbar-graph edges if both edges have identical edge annotations or both have no annotations. Methods for determining a graph monomorphism with annotated nodes and edges are well-known in the art. A method for determining a graph monomorphism with annotated node and edge constraints is given by *VF Graph Matching Library,* SIVA Lab, University of Naples "Federico II" and is incorporated by reference.

FIG. 18 illustrates the results obtained from a successful hypothetical search for a graph monomorphism between circuit graph 1601, shown in FIG. 16, and crossbar graph 1701, shown in FIG. 17. In FIG. 18, circuit graph 1601 is monomorphic to graph monomorphism 1801. For example, circuit-graph nodes 1802–1805 correspond to nodes 1806–1809, respectively, and circuit-graph edges 1810–1812 correspond to edges 1813–1815, respectively. Circuit-graph nodes 1816–1818 correspond to nodes 1819–1821, respectively, and circuit-graph edges 1822–1823 correspond to edges 1824–1825, respectively.

A graph monomorphism can then be used to allocate nanowire junctions in the nanowire crossbar in order to implement the circuit. The allocation of nanowire junctions in a nanowire crossbar is accomplished by reversing the procedure used to construct the crossbar graph. For example, nanowire crossbar 1826 is an allocation of nanowire junctions represented by graph 1801 that implements circuit 1600. Nodes 1806–1807, 1819 and 1821 correspond to vertical nanowires 1827–1831, respectively, and nodes 1808 and 1820 correspond to horizontal nanowires 1832 and 1833, respectively. The nanowire junctions in the nanowire-crossbar are configured according to the edges present in the monomorphic subgraph. For example, edge 1813 represents a resistor-nanowire junction located at the crossing of nanowires 1827 and 1832 in the nanowire crossbar 1826 because nodes 1806 and 1808 represent nanowires 1827 and 1832, respectively. Thus, nanowire junction 1834 is configured as a resistor-nanowire junction.

Note that not all searches for an allocation of nanowire junctions are guaranteed success. It may be the case that a search will not be able to determine a graph monomorphism. Note also that dividing the nanowire junction allocation problem into separate microregion allocations typically fails, because a particular allocation of nanowire junctions in one microregion may actually preclude a successful allocation in an adjacent but different microregion.

Figure 19:
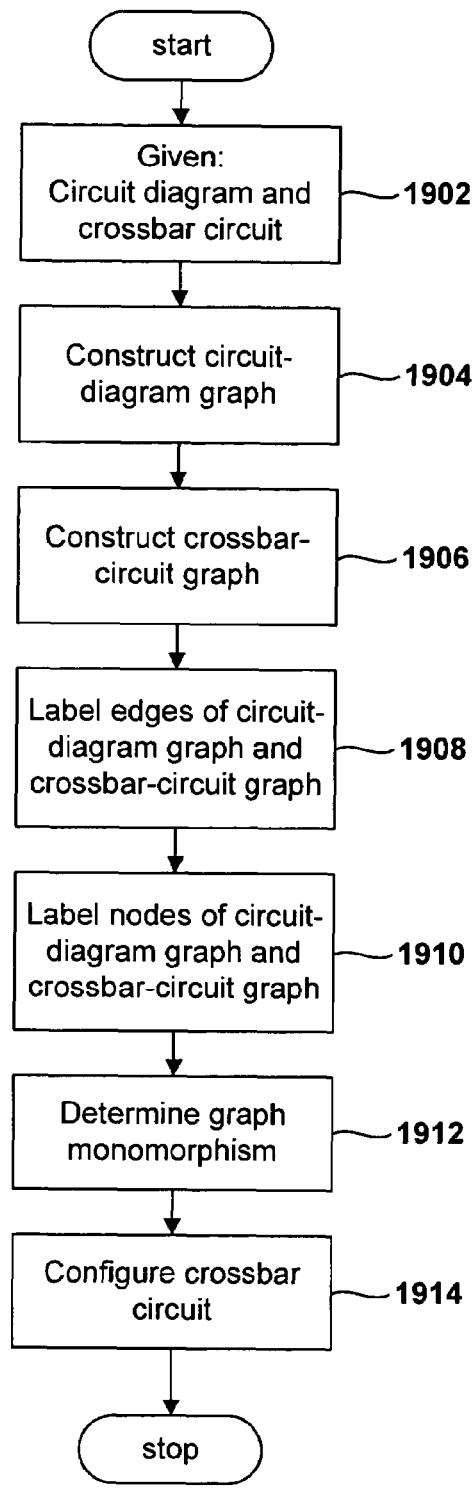
FIG. 19 is a control-flow diagram that represents one of many possible methods of the present invention for allocating nanowire junctions of nanowire crossbars having one or more randomly distributed non-functional nanowire junctions, based on a circuit.

FIG. 19 is a control-flow diagram that represents one of many possible methods of the present invention for allocating nanowire junctions of nanowire crossbars having a random distribution of one or more non-functional nanowire junctions, based on a circuit. In step 1902, the input is composed of a circuit and a nanowire crossbar having non-functional nanowire junctions. In step 1904, a circuit graph that represents the circuit is constructed, as described above with reference to FIGS. 13–16. In step 1906, a crossbar graph is constructed, as described above with reference to FIGS. 14–15, and 17. In step 1908, edges of circuit graph and crossbar graph are annotated, as described above with reference to FIGS. 16–17. In step 1910, nodes of circuit graph and crossbar graph are annotated, as described above with reference to FIGS. 16–17. In step 1912, a graph monomorphism search is conducted, as described above with reference to FIG. 18. In step 1914, the graph monomorphism can be used to allocate nanowire junctions of the nanowire crossbar, as described above with reference to FIG. 18.

Although the present invention has been described in terms of particular embodiments, it is not intended that the invention be limited to these embodiments. Modifications within the spirit of the invention will be apparent to those skilled in the art. For example, in alternate embodiments, circuit-graph nodes can represent circuit components and circuit-graph edges can represent circuit nanowires, and crossbar-graph nodes can represent nanowire junctions and crossbar-graph edges can represent nanowires. Moreover, an almost limitless number of programs that carry out the methods encompassed by the present invention can be implemented.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. A method for allocating nanowire junctions in a nanowire crossbar, the method comprising:
   receiving a circuit;
   receiving a nanowire crossbar having one or more randomly distributed non-functional nanowire junctions;
   constructing a circuit graph based on the circuit;
   constructing a crossbar graph based on the nanowire crossbar;
   searching for a graph monomorphism based on the circuit graph and the crossbar graph; and
   allocating nanowire junctions of the nanowire crossbar based on the graph monomorphism.

2. The method of claim 1 wherein constructing the circuit graph further includes representing each circuit wire by a circuit-graph node and representing each circuit component by a circuit-graph edge.

3. The method of claim 1 wherein searching for the graph monomorphism based on the circuit graph and the crossbar graph further includes annotating circuit-graph nodes, circuit-graph edges, crossbar-graph nodes, and crossbar graph edges.

4. The method of claim 3 wherein annotating circuit-graph nodes, circuit-graph edges, crossbar-graph nodes, and crossbar graph edges further includes:
   annotating circuit-graph edges to represent the functionality of the corresponding circuit component; and
   annotating crossbar-graph edges to represent the functionality of the corresponding functional nanowire junction.

5. The method of claim 3 wherein annotating circuit-graph nodes, circuit-graph edges, crossbar-graph nodes, and crossbar graph edges further includes annotating circuit-graph nodes and annotating crossbar-graph nodes so that node annotations of the circuit graph match node annotations of the crossbar graph.

6. The method of claim 5 wherein annotating each circuit-graph node further includes annotating circuit-graph nodes to identify circuit wires used to receive input signals.

7. The method of claim 5 wherein annotating each circuit-graph node further includes annotating circuit-graph nodes to identify circuit wires used to carry output signals.

8. The method of claim 5 wherein annotating each crossbar-graph node further includes annotating crossbar-graph nodes to identify nanowires used to receive input signals.

9. The method of claim 5 wherein annotating each circuit-graph node further includes annotating crossbar-graph nodes to identify nanowires used to carry output signals.

10. The method of claim 3 wherein searching for the graph monomorphism based on the circuit graph and the crossbar graph further includes constraining circuit-graph node annotations to match crossbar-graph nodes annotations.

11. The method of claim 3 wherein searching for the graph monomorphism based on the circuit graph and the crossbar graph based on the circuit graph and the crossbar graph further includes constraining circuit-graph edge annotations to match crossbar-graph edge annotations.

12. The method of claim 1 wherein searching for the graph monomorphism based on the circuit graph and the crossbar graph further includes determining a monomorphism that maps the circuit-graph nodes to a subset of crossbar-graph nodes and maps the circuit-graph edges to a subset of crossbar-graph edges.

13. The method of claim 1 wherein allocating the nanowire junctions further includes matching the graph monomorphism nodes with nanowire-crossbar nanowires and matching graph monomorphism edges with functional nanowire junctions.

14. The method of claim 13 wherein allocating the nanowire junctions further includes configuring the functional nanowire junctions to match the graph monomorphism edges.

15. A computer instruction encoded in a computer readable medium that allocates nanowire junctions in a nanowire crossbar having one or more randomly distributed non-functional nanowire junctions by:
   receiving circuit data;
   receiving nanowire-crossbar data associated with a nanowire crossbar;
   constructing a circuit graph based on the circuit data;
   constructing a crossbar graph based on the nanowire-crossbar data;
   searching for a graph monomorphism based on the circuit graph and the crossbar graph; and
   outputting an allocation of functional nanowire junctions in the nanowire crossbar.

16. The computer instruction of claim 15 wherein constructing the circuit graph further includes representing each circuit wire by a circuit-graph node and representing each circuit component by a circuit-graph edge.

17. The computer instruction 15 wherein searching for the graph monomorphism based on the circuit graph and the crossbar graph further includes annotating circuit-graph nodes, circuit-graph edges, crossbar-graph nodes, and crossbar graph edges.

18. The computer instruction 17 wherein annotating circuit-graph nodes, circuit-graph edges, crossbar-graph nodes, and crossbar graph edges further includes:
   annotating circuit-graph edges to represent the functionality of the corresponding circuit component; and
   annotating crossbar-graph edges to represent the functionality of the corresponding functional nanowire junction.

19. The computer instruction 17 wherein annotating circuit-graph nodes, circuit-graph edges, crossbar-graph nodes, and crossbar graph edges further includes annotating circuit-graph nodes and annotating crossbar-graph nodes so that node annotations of the circuit graph match node annotations of the crossbar graph.

20. The computer instruction of claim 19 wherein annotating each circuit-graph node further includes annotating circuit-graph nodes to identify circuit wires used to receive input signals.

21. The computer instruction of claim 19 wherein annotating each circuit-graph node further includes annotating circuit-graph nodes to identify circuit wires used to carry output signals.

22. The computer instruction of claim 19 wherein annotating each crossbar-graph node further includes annotating crossbar-graph nodes to identify nanowires used to receive input signals.

23. The computer instruction of claim 19 wherein annotating each circuit-graph node further includes annotating crossbar-graph nodes to identify nanowires used to carry output signals.

24. The computer instruction of claim 17 wherein searching for the graph monomorphism based on the circuit graph and the crossbar graph further includes constraining circuit-graph node annotations to match crossbar-graph nodes annotations.

25. The computer instruction of claim 17 wherein searching for the graph monomorphism based on the circuit graph and the crossbar graph further includes constraining circuit-graph edge annotations to match crossbar-graph edge annotations.

26. The computer instruction of claim 15 wherein searching for the graph monomorphism based on the circuit graph and the crossbar graph further includes determining a monomorphism that maps the circuit-graph nodes to a subset of crossbar-graph nodes and maps the circuit-graph edges to a subset of crossbar-graph edges.

27. The computer instruction of claim 15 wherein allocating the nanowire junctions further includes matching the graph monomorphism nodes with nanowire-crossbar nanowires and matching monomorphic subgraph edges with functional nanowire junctions.

28. The computer instruction of claim 27 wherein allocating the nanowire junctions further includes configuring the functional nanowire junctions to match the graph monomorphism edges.

* * * * *

UNITED STATES PATENT AND TRADEMARK OFFICE
CERTIFICATE OF CORRECTION

PATENT NO.        : 7,254,799 B2
APPLICATION NO.   : 11/047981
DATED             : August 7, 2007
INVENTOR(S)       : Gregory S. Snider It is certified that error appears in the above-identified patent and that said Letters Patent is hereby corrected as shown below:

On sheet 10 of 17, in Fig. 12, under tag "1200", delete "D" and insert -- D' --, therefor.

In column 11, line 9, delete "U=$\{u_1, u_2, u_5, u_4\}$" and insert -- U=$\{u_1, u_2, u_3, u_4\}$ --, therefor.

In column 18, line 36, in Claim 17, after "instruction" insert -- of claim --.

In column 18, line 41, in Claim 18, after "instruction" insert -- of claim --.

In column 18, line 49, in Claim 19, after "instruction" insert -- of claim --.

Signed and Sealed this

Fourteenth Day of July, 2009

JOHN DOLL
*Acting Director of the United States Patent and Trademark Office*